United States Patent
Wiliams

(10) Patent No.: US 7,043,617 B2
(45) Date of Patent: *May 9, 2006

(54) SYSTEM SUPPORTING MULTIPLE MEMORY MODES INCLUDING A BURST EXTENDED DATA OUT MODE

(75) Inventor: Brett L. Wiliams, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/510,375

(22) Filed: Feb. 22, 2000

(65) Prior Publication Data

US 2001/0032290 A1 Oct. 18, 2001

Related U.S. Application Data

(63) Continuation of application No. 08/457,650, filed on Jun. 1, 1995, now Pat. No. 6,804,760, which is a continuation-in-part of application No. 08/386,894, filed on Feb. 10, 1995, now Pat. No. 5,610,864, which is a continuation-in-part of application No. 08/370,761, filed on Dec. 23, 1994, now Pat. No. 5,526,320.

(51) Int. Cl.
*G06F 12/00* (2006.01)

(52) U.S. Cl. ............... 711/170; 711/5; 711/105; 714/719; 714/22; 365/189.01; 365/230.03; 713/340; 713/600

(58) Field of Classification Search ............... 711/170, 711/5, 105, 115; 714/718–723, 22; 365/189.01, 365/230.01, 230.03; 713/330, 340, 400, 600
See application file for complete search history.

(56) References Cited

U.S. PATENT DOCUMENTS

| | | | |
|---|---|---|---|
| 4,195,770 A | 4/1980 | Benton et al. | 371/21.2 |
| 4,344,156 A | 8/1982 | Eaton et al. | 365/203 |
| 4,484,308 A | 11/1984 | Lewandowski et al. | 364/900 |

(Continued)

FOREIGN PATENT DOCUMENTS

| | | |
|---|---|---|
| DE | 19507562 | 9/1995 |
| EP | 0468480 | 1/1992 |
| JP | 61-170994 | 8/1986 |

(Continued)

OTHER PUBLICATIONS

Ewald.Jenisch@univie.ac.at, "P 55TP4 (Triton–based)–SYNC/BURST SRAMS?", Mar. 22, 1995, pp1–2, www.goggle.com.*

(Continued)

*Primary Examiner*—Hong Kim
(74) *Attorney, Agent, or Firm*—Schwegman, Lundberg, Woessner & Kluth, P.A.

(57) ABSTRACT

A system is capable of receiving Fast Page mode, Extended Data Out mode, Burst Extended Data Out mode, or a combination of these memory devices. A method of determining the type of memory present allows the system to adjust internal memory access signals in accordance with the type of memory installed. The system may be shipped with a first type of memory, and then upgraded to a second type of memory by the user to improve overall system performance. A first bank of memory may be of a first type, and a second bank may be of another type. The user may make cost versus performance decisions when upgrading memory types or capacities.

24 Claims, 10 Drawing Sheets

U.S. PATENT DOCUMENTS

| | | | |
|---|---|---|---|
| 4,510,603 A | 4/1985 | Catiller | 371/21 |
| 4,513,389 A | 4/1985 | Devchoudhury | 364/900 |
| 4,519,028 A | 5/1985 | Olsen et al. | |
| 4,562,555 A | 12/1985 | Ouchi et al. | 365/233 |
| 4,567,579 A | 1/1986 | Patel et al. | 365/189 |
| 4,575,825 A | 3/1986 | Ozaki et al. | 365/189 |
| 4,594,587 A | 6/1986 | Chandler et al. | |
| 4,603,403 A | 7/1986 | Toda | 365/189 |
| 4,618,947 A | 10/1986 | Tran et al. | 365/230 |
| 4,649,522 A | 3/1987 | Kirsch | 365/189 |
| 4,685,089 A | 8/1987 | Patel et al. | 365/233 |
| 4,707,811 A | 11/1987 | Takemae et al. | 365/239 |
| 4,766,431 A | 8/1988 | Kobayashi et al. | |
| 4,788,667 A | 11/1988 | Nakano et al. | 365/193 |
| 4,851,990 A | 7/1989 | Johnson et al. | |
| 4,857,899 A | 8/1989 | Ishii | |
| 4,870,622 A | 9/1989 | Aria et al. | 365/230.02 |
| 4,875,192 A | 10/1989 | Matsumoto | 365/193 |
| 4,926,314 A | 5/1990 | Dhuey | 364/200 |
| 4,993,027 A | 2/1991 | McGraw et al. | 371/16.2 |
| 5,058,066 A | 10/1991 | Yu | 365/189.05 |
| 5,126,975 A | 6/1992 | Handy et al. | 365/230.01 |
| 5,146,582 A | 9/1992 | Begun | |
| 5,175,835 A | 12/1992 | Beighe et al. | |
| 5,237,689 A | 8/1993 | Behnke | 395/700 |
| 5,243,699 A | 9/1993 | Nickolls et al. | |
| 5,253,357 A * | 10/1993 | Allen et al. | 711/115 |
| 5,261,064 A * | 11/1993 | Wyland | 711/211 |
| 5,267,200 A | 11/1993 | Tobita | 365/189.05 |
| 5,268,865 A | 12/1993 | Takasugi | 365/189.05 |
| 5,278,801 A * | 1/1994 | Dresser et al. | 365/230.02 |
| 5,280,594 A | 1/1994 | Young et al. | 395/425 |
| 5,301,278 A | 4/1994 | Bowater et al. | 395/275 |
| 5,305,284 A | 4/1994 | Iwase | 365/238.5 |
| 5,307,320 A * | 4/1994 | Farrer et al. | 365/230.01 |
| 5,309,398 A | 5/1994 | Nagase et al. | |
| 5,325,330 A | 6/1994 | Morgan | 365/189.05 |
| 5,325,502 A | 6/1994 | McLaury | 395/425 |
| 5,325,513 A * | 6/1994 | Tanaka et al. | 710/16 |
| 5,327,390 A | 7/1994 | Takasugi | |
| 5,331,471 A | 7/1994 | Matsumoto et al. | |
| 5,331,593 A | 7/1994 | Merritt et al. | |
| 5,349,566 A | 9/1994 | Merritt et al. | 365/233.5 |
| 5,357,469 A | 10/1994 | Sommer et al. | 365/193 |
| 5,369,622 A | 11/1994 | McLaury | |
| 5,373,227 A | 12/1994 | Keeth | 323/313 |
| 5,379,261 A | 1/1995 | Jones, Jr. | 365/230.01 |
| 5,392,239 A * | 2/1995 | Margulis et al. | 365/189.01 |
| 5,394,535 A | 2/1995 | Ohuchi | 395/425 |
| 5,410,670 A | 4/1995 | Hansen et al. | 395/425 |
| 5,426,606 A | 6/1995 | Takai | |
| 5,452,261 A * | 9/1995 | Chung et al. | 365/233 |
| 5,457,659 A | 10/1995 | Schaefer | 365/222 |
| 5,499,355 A | 3/1996 | Krishnamohan et al. | |
| 5,513,148 A | 4/1996 | Zager | 365/233 |
| 5,522,064 A | 5/1996 | Aldereguia et al. | 395/550 |
| 5,526,320 A | 6/1996 | Zagar et al. | 365/233.5 |
| 5,561,814 A | 10/1996 | Glew et al. | 395/833 |
| 5,568,651 A * | 10/1996 | Medina et al. | 710/74 |
| 5,587,950 A | 12/1996 | Sawada et al. | |
| 5,587,964 A | 12/1996 | Rosich et al. | |
| 5,590,078 A * | 12/1996 | Chatter | 365/189.01 |
| 5,594,704 A | 1/1997 | Konishi et al. | |
| 5,604,880 A * | 2/1997 | Dipert | 711/103 |
| 5,610,864 A | 3/1997 | Manning | 365/193 |
| 5,630,163 A * | 5/1997 | Fung et al. | 710/127 |
| 5,640,507 A | 6/1997 | Lipe | 395/183.01 |
| 5,654,932 A | 8/1997 | Rao | 365/230.03 |
| 5,682,354 A | 10/1997 | Manning | |
| 5,701,438 A * | 12/1997 | Bains | 711/211 |
| 5,713,011 A | 1/1998 | Satoh et al. | 395/556 |
| 5,721,860 A * | 2/1998 | Stolt et al. | 711/105 |
| 5,748,560 A | 5/1998 | Sawada | 365/233 |
| 5,752,269 A | 5/1998 | Divivier et al. | |
| 5,754,838 A | 5/1998 | Shibata et al. | 395/559 |
| 5,784,331 A | 7/1998 | Lysinger | 365/230.06 |
| 5,787,308 A * | 7/1998 | Suzuki et al. | 710/19 |
| 5,812,488 A | 9/1998 | Zagar et al. | |
| 5,812,490 A | 9/1998 | Tsukude et al. | 365/233 |
| 5,815,462 A | 9/1998 | Konishi et al. | |
| 5,822,581 A * | 10/1998 | Christeson | 713/1 |
| 5,825,691 A | 10/1998 | McClure | 365/189.01 |
| 5,831,924 A | 11/1998 | Nitta et al. | 365/230.03 |
| 5,838,990 A | 11/1998 | Park et al. | 395/834 |
| 5,844,849 A | 12/1998 | Furutani | 365/194 |
| 5,854,911 A | 12/1998 | Watkins | |
| 5,893,136 A * | 4/1999 | Stolt et al. | 711/105 |
| 5,903,514 A | 5/1999 | Sawada | 365/233 |
| 5,946,265 A | 8/1999 | Cowles | 365/233 |
| 5,953,278 A | 9/1999 | McAdams et al. | 365/219 |
| 5,966,724 A | 10/1999 | Ryan | |
| 6,006,290 A | 12/1999 | Suh | |
| 6,006,339 A | 12/1999 | McClure | 713/500 |
| 6,061,296 A | 5/2000 | Ternullo, Jr. et al. | 365/233 |
| 6,069,839 A | 5/2000 | Pancholy et al. | 365/233 |
| 6,112,284 A * | 8/2000 | Hayek et al. | 711/167 |
| 6,130,843 A | 10/2000 | Lee | 365/189.05 |
| 6,161,177 A * | 12/2000 | Anderson | 713/2 |
| 6,172,935 B1 | 1/2001 | Wright et al. | 365/233 |
| 6,336,152 B1 * | 1/2002 | Richman et al. | 710/8 |
| 6,381,180 B1 | 4/2002 | Merritt et al. | |
| 6,449,735 B1 * | 9/2002 | Edwards et al. | 714/25 |
| 6,505,282 B1 * | 1/2003 | Langendorf et al. | 711/170 |
| 6,525,971 B1 | 2/2003 | Merritt et al. | |
| 6,804,760 B1 * | 10/2004 | Wiliams | 711/170 |
| 6,914,830 B1 | 7/2005 | Merritt et al. | |
| 2001/0032290 A1 | 10/2001 | Williams | |
| 2002/0001234 A1 | 1/2002 | Merritt et al. | |
| 2002/0133665 A1 | 9/2002 | Mailloux et al. | |
| 2002/0196668 A1 | 12/2002 | Meritt et al. | |
| 2003/0002336 A1 | 1/2003 | Merritt et al. | |
| 2003/0002350 A1 | 1/2003 | Merritt et al. | |
| 2003/0063502 A1 | 4/2003 | Merritt et al. | |
| 2003/0063512 A1 | 4/2003 | Takahashi et al. | |
| 2003/0067817 A1 | 4/2003 | Merritt et al. | |

FOREIGN PATENT DOCUMENTS

| | | |
|---|---|---|
| JP | 5-89663 | 4/1993 |
| JP | 5-282859 | 10/1993 |
| JP | 06060658 | 3/1994 |
| JP | 6-325599 | 11/1994 |
| JP | 6-333393 | 12/1994 |
| WO | WO-96/20482 | 7/1996 |

OTHER PUBLICATIONS

"Intel", Electronic News, p. 26, Dec. 5, 1994.*

Intel, "82430FX PCIset Datasheet 82437FX System/Controller (TSC) and 82438FX Data Path Unit CTDP", pp 1–67, Nov. 1996.*

Micron, "Reduce DRAM Cycle Times With Extended Data–Out", Technical Note, 1994 DRAM Data Book, Micron Semiconductor, Inc. pp 5–33 thru 5–40, Apr. 1994.*

Old Simcheck Product Line, [Online] Available http://www.simcheck.com/sim–1pl.htm.*

Kristina Sullivan, "Simcheck Add–on Lets Users Identify Faulty DRAM Chips", PC Week, v7 n18 p18(1), May 7, 1990.*

"Synchronous DRAM 2 MEG X 8 SDRAM", *Micron Semiconductors, Inc.*, (1994),pp. 1–18.

Crothers, B., "Pentium processors contribute to EDO memory's popularity", *InfoWorld,* vol. 17, No. 7, 37(1), (Feb. 13, 1995).

Kovsky, S., "Intel's Triton chip set moves to notebooks", *PC Week*vol. 12, No. 16, 47(1), (Apr. 24, 1995).

Jenisch, E., et al., "P55TP4 (Triton–based)–SYNC/BURST SRAMS?", www.google.com, (1995), 7 pages.

"16MS DRAM Schematics", *Micron Technology,* pp. 1–58, (Feb. 1993).

"2Mx8 Synchronous DRAM Schematics, Rev. 1.9", *Micron Technology,* pp. 357495–357595, (Dec. 1995).

"2Mx8 Synchronous Dram Schematicsm, Rev. 1.5", *Micron Technology,* pp. 1–85, (May 1994).

McAlexander, J.C., *Third Supplemental Expert Report,* In the U.S District Court for the District of Delaware; Mosel Vitelic Coporation, Plaintiff, v. Micron Technology, Inc., Defendant; Micron Technology Inc., Counter–Plaintiff, v. Mosel Vitelic Corporation and Counter–Defendants; No. 98–449–GMS, pp. 1–28, (1998).

Tatosian, D., "Detecting EDO RAM with Triton Mainboards", http://www.deganews.com, 2 pgs., (1995).

Cameron 944 @aol.com, www.dejanews.com, (1995).

"Rossini, Pentium, PCI–ISA, Chip Set", *Symphony Laboratories,* entire book.

"4DRAM 1991", *Toshiba America Electronic Components, Inc.,* pp. A–137–A–159.

"Application Specific DRAM", *Toshiba America Electronic Components, Inc.,* C178, C–260, C 218, (1994).

"Burst DRAM Function & Pinout", *Oki Electric Ind., Co., Ltd., 2nd Presentation, Item # 619,* (Sep. 1994).

"Chips: Intel Corp. intros higher performing PCI chip set for Pentium processors; Triton architecture unlocks Pentium processor power necessary for multitude of applications (Intel Corp.'s 82430FX)", *EDGE: Work–Group Computing Report,* vol. 6, No. 246, 10(1), (1995).

"DRAM 1 Meg X 4 DRAM 5VEDO Page Mode", *Micron Technology, Inc. DRAM Data Book,* pp. 1–1 thru 1–30, (1995).

"Hyper Page Mode DRAM", *Electronic Engineering, 66,* No. 813, Woolwich, London, GB, pp. 47–48, (Sep. 1994).

"Intel Readies Triton PCI chipset (Intel's 82430FX)", *Electronic News,* vol. 41, No. 2050, 68(1), (1995).

"Mosel–Vitelic V53C8257H DRAM Specification Sheet", 20 pgs., (Jul. 2, 1994).

"Pipelined Burst DRAM", *Toshiba, JEDEC JC 42.3 Hawaii,* (Dec. 1994).

"Samsung Synchronous DRAM", *Samsung Electronics,* pp. 1–16, (Mar. 1993).

Advanced, "Advanced ZP Expandable Desktop Baseboard", *Technical Product Summary, Version 1.0,* (1995).

Bursky, D., "Novel I/O Options and Innovative Architectures Let DRAMs Achieve SRAM Performance; Fast DRAMS can be swapped for SRAM Caches", *Electronic Design, 41,* pp. 55, 56, 60,62,64, (Jul. 1993).

Gowni, et al., "Synchronous Cache RAM with Burst ;Mode Access", *IEEE 1992 Custom Integrated Circuits Conference,* Boston USA, pp 781–784, (May 1992).

In: *1996 DRAM Data Book,* Micron Technology, Inc. (1996), 1/1–1/52.

In: *1996 DRAM Data Book,* Micron Technology, Inc. (1996), pp. 5/75, 7/62.

Office Action dated Jun. 18, 2003 from related U.S. Appl. No. 10/232,977 (2003), 7 pgs.

Office Action Dated Jun. 4, 2003 from related U.S. Appl. No. 10/232,092 (2003), 7 pgs.

*1995 DRAM Data Book,* Micron Technology, Inc., (1995), 1–42.

"4M DRAM", Toshiba American Electronic Components, Inc.,(1991), A–137–A–159.

"Burst DRAM Function & Pinout", Oki Electric Ind. Co., Ltd., 2nd Presentation, Item #619, (Sep. 1994), 5 pgs.

"Burst EDO DRAM Information", Micron Technology, Inc., (Sep. 1995), 1–126.

"Burst Edo Memory Device", *PCT Patent Application PCT/US95/16984,* (Dec. 22, 1995).

"Burst Edo Memory Device Address Counter", PCT Application PCT/US95/16656, (Dec. 21, 1995).

"Command Truth Table", NEC,(1993), 1 pg.

"DRAM 1 Meg x 4 DRAM 5VEDO Page Mode", *1995 DRAM Data Book,* Micron Technology, Inc.,(1995), 1/1–1/30.

"Hyper page mode DRAM", *Electronic Engineering, 66(813),* (Sep. 1994), 47–48.

"Integrated Circuit Technical Data–262, 144 Words x 8 Bits Multiport DRAM", Toshiba Corp., TC52826TS/Z/FT/TR, TEN. Rev.2.1,(1980), 1–63.

"KM48SV2000 Preliminary CMOS SDRAM", Samsung Electronics, (Mar. 1993), 7–8.

"Mitsubishi Samples 16M Synch DRAM", *Electronic News,* (1993), 3–4.

"Performance: Fast DRAMS can be swapped for SRAM Caches", *Electronic Design,* vol. 41, No. 15, Cleveland, Ohio, (Jul. 22, 1993), 55–67.

"S3 Burst Mode DRAM", *S3 Incorporated,* Santa Clara, CA, (Jun. 1993), 2 pages.

"Samsung Synchronous DRAM", *Samsung Electronics, Revision 1,* (Mar. 1993), 1–16.

"Synchronous DRAM 4 Meg x 4 SDRAM", Micron Semiconductor, Inc., (1983), 1–42.

Micron Semiconductor, Inc., "Synchronous DRAM 2 MEG x 8 SDRAM", *Micron Semiconductor, Inc.,* (Apr. 1994), 1–18.

Toshiba, "Application Specific DRAM", Toshiba American Electronic Components, Inc.,(1994), pp. C–178, C–260, C–218.

\* cited by examiner

| Burst Length | Starting Column Address A₂ A₁ A₀ | | | Linear | Interleave |
|---|---|---|---|---|---|
| 2 | V | V | 0 | 0-1 | 0-1 |
| 2 | V | V | 1 | 1-0 | 1-0 |
| 4 | V | 0 | 0 | 0-1-2-3 | 0-1-2-3 |
| 4 | V | 0 | 1 | 1-2-3-0 | 1-0-3-2 |
| 4 | V | 1 | 0 | 2-3-0-1 | 2-3-0-1 |
| 4 | V | 1 | 1 | 3-0-1-2 | 3-2-1-0 |
| 8 | 0 | 0 | 0 | 0-1-2-3-4-5-6-7 | 0-1-2-3-4-5-6-7 |
| 8 | 0 | 0 | 1 | 1-2-3-4-5-6-7-0 | 1-0-3-2-5-4-7-6 |
| 8 | 0 | 1 | 0 | 2-3-4-5-6-7-0-1 | 2-3-0-1-6-7-4-5 |
| 8 | 0 | 1 | 1 | 3-4-5-6-7-0-1-2 | 3-2-1-0-7-6-5-4 |
| 8 | 1 | 0 | 0 | 4-5-6-7-0-1-2-3 | 4-5-6-7-0-1-2-3 |
| 8 | 1 | 0 | 1 | 5-6-7-0-1-2-3-4 | 5-4-7-6-1-0-3-2 |
| 8 | 1 | 1 | 0 | 6-7-0-1-2-3-4-5 | 6-7-4-5-2-3-0-1 |
| 8 | 1 | 1 | 1 | 7-0-1-2-3-4-5-6 | 7-6-5-4-3-2-1-0 |

FIG. 2

| PIN # | SYMBOL | PIN # | SYMBOL | PIN # | SYMBOL | PIN # | SYMBOL |
|---|---|---|---|---|---|---|---|
| 1 | Vss | 19 | A10 | 37 | NC | 55 | DQ12 |
| 2 | DQ1 | 20 | DQ5 | 38 | NC | 56 | DQ28 |
| 3 | DQ17 | 21 | DQ21 | 39 | Vss | 57 | DQ13 |
| 4 | DQ2 | 22 | DQ6 | 40 | $\overline{CAS0}$ | 58 | DQ29 |
| 5 | DQ18 | 23 | DQ22 | 41 | $\overline{CAS2}$ | 59 | Vcc |
| 6 | DQ3 | 24 | DQ7 | 42 | $\overline{CAS3}$ | 60 | DQ30 |
| 7 | DQ19 | 25 | DQ23 | 43 | $\overline{CAS1}$ | 61 | DQ14 |
| 8 | DQ4 | 26 | DQ8 | 44 | $\overline{RAS0}$ | 62 | DQ31 |
| 9 | DQ20 | 27 | DQ24 | 45 | $\overline{RAS1}$ | 63 | DQ15 |
| 10 | Vcc | 28 | A7 | 46 | $\overline{OE}$ | 64 | DQ32 |
| 11 | PD5 | 29 | NC | 47 | $\overline{WE}$ | 65 | DQ16 |
| 12 | A0 | 30 | Vcc | 48 | PD ECC | 66 | PD EDO |
| 13 | A1 | 31 | A8 | 49 | DQ9 | 67 | PD1 |
| 14 | A2 | 32 | A9 | 50 | DQ25 | 68 | PD2 |
| 15 | A3 | 33 | NC | 51 | DQ10 | 69 | PD3 |
| 16 | A4 | 34 | NC | 52 | DQ26 | 70 | PD4 |
| 17 | A5 | 35 | NC | 53 | DQ11 | 71 | PD refresh |
| 18 | A6 | 36 | NC | 54 | DQ27 | 72 | Vss |

SYSTEM SUPPORTING MULTIPLE MEMORY MODES INCLUDING A BURST EXTENDED DATA OUT MODE

This application is a continuation of U.S. Ser. No. 08/457,650 filed Jun. 1, 1995, now U.S. Pat. No. 6,804,760, [which is a continuation-in-part of U.S. Ser. No. 08/386,894 filed Feb. 10, 1995, now U.S. Pat. No. 5,610,864, which is a continuation-in-part of U.S. Ser. No. 08/370,761 filed Dec. 23, 1994, now U.S. Patent No. 5,526,320.]

FIELD OF THE INVENTION

This invention relates to system architectures adapted to receive multiple types of memory devices and methods of determining the type of memory present.

BACKGROUND OF THE INVENTION

Dynamic Random Access Memory devices (DRAMs) are among the highest volume and most complex integrated circuits manufactured today. Except for their high volume production, the state of the art manufacturing requirements of these devices would cause them to be exorbitantly priced. Yet, due to efficiencies associated with high volume production, the price per bit of these memory devices is continually declining. The low cost of memory has fueled the growth and development of the personal computer. As personal computers have become more advanced, they in turn have required faster and more dense memory devices, but with the same low cost of the standard DRAM. Fast page mode DRAMs are the most popular standard DRAM today. In fast page mode operation, a row address strobe (/RAS) is used to latch a row address portion of a multiplexed DRAM address. Multiple occurrences of the column address strobe (/CAS) are then used to latch multiple column addresses to access data within the selected row. On the falling edge of /CAS an address is latched, and the DRAM outputs are enabled. When /CAS transitions high the DRAM outputs are placed in a high impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. /CAS may be low for as little as 15 nanoseconds, and the data access time from /CAS to valid output data (tCAC) may be up to 15 nanoseconds; therefore, in a worst case scenario there is no time to latch the output data external to the memory device. For devices that operate faster than the specifications require, the data may still only be valid for a few nanoseconds. On a heavily loaded microprocessor memory bus, trying to latch an asynchronous signal that is valid for only, a few nanoseconds is very difficult. Even providing a new address every 35 nanoseconds requires large address drivers which create significant amounts of electrical noise within the system. To increase the data throughput of a memory system, it has been common practice to place multiple devices on a common bus. For example, two fast page mode DRAMs may be connected to common address and data buses. One DRAM stores data for odd addresses, and the other for even addresses. The /CAS signal for the odd addresses is turned off (high) when the /CAS signal for the even addresses is turned on (low). This interleaved memory system provides data access at twice the rate of either device alone. If the first /CAS is low for 20 nanoseconds and then high for 20 nanoseconds while the second /CAS goes low, data can be accessed every 20 nanoseconds or 50 megahertz. If the access time from /CAS to data valid is fifteen nanoseconds, the data will be valid for only five nanoseconds at the end of each 20 nanosecond period when both devices are operating in fast page mode. As cycle times are shortened, the data valid period goes to zero.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after /CAS goes high until sometime after the next /CAS low pulse occurs, or until /RAS or the output enable (/OE) goes high. Determining when valid data will arrive at the outputs of a fast page mode or EDO DRAM can be a complex function of when the column address inputs are valid, when /CAS falls, the state of /OE and when /CAS rose in the previous cycle. The period during which data is valid with respect to the control line signals (especially /CAS) is determined by the specific implementation of the EDO mode, as adopted by the various DRAM manufacturers.

Methods to shorten memory access cycles tend to require additional circuitry, additional control pins and nonstandard device pinouts. The proposed industry standard synchronous DRAM (SDRAM) for example has an additional pin for receiving a system clock signal. Since the system clock is connected to each device in a memory system, it is highly loaded, and it is always toggling circuitry in every device. SDRAMs also have a clock enable pin, a chip select pin and a data mask pin. Other signals which appear to be similar in name to those found on standard DRAMs have dramatically different functionality on a SDRAM. The addition of several control pins has required a deviation in device pinout from standard DRAMs which further complicates design efforts to utilize these new devices. Significant amounts of additional circuitry are required in the SDRAM devices which in turn result in higher device manufacturing costs.

In order for existing computer systems to use an improved device having a nonstandard pinout, those systems must be extensively modified. Additionally, existing computer system memory architectures are designed such that control and address signals may not be able to switch at the frequencies required to operate the new memory device at high speed due to large capacitive loads on the signal lines. The Single In-Line Memory Module (SIMM) provides an example of what has become an industry standard form of packaging memory in a computer system. On a SIMM, all address lines connect to all DRAMs. Further, the row address strobe (/RAS) and the write enable (/WE) are often connected to each DRAM on the SIMM. These lines inherently have high capacitive loads as a result of the number of device inputs driven by them. SIMM devices also typically ground the output enable (/OE) pin making /OE a less attractive candidate for providing extended functionality to the memory devices.

There is a great degree of resistance to any proposed deviations from the standard SIMM design due to the vast number of computers which use SIMMs. Industry's resistance to radical deviations from the standard, and the inability of current systems to accommodate the new memory devices will delay their widespread acceptance. Therefore only limited quantities of devices with radically different architectures will be manufactured initially. This limited manufacture prevents the reduction in cost which typically can be accomplished through the manufacturing improvements and efficiencies associated with a high volume product.

SUMMARY OF THE INVENTION

An integrated circuit memory device with a standard DRAM pinout is designed for high speed data access and for compatibility with existing memory systems. A high speed burst mode of operation is provided where multiple sequential accesses occur following a single column address, and read data is output relative to the /CAS control signal. In the burst mode of operation the address is incremented internal to the device eliminating the need for external address lines to switch at high frequencies. Read/Write commands are issued once per burst access eliminating the need to toggle the Read/Write control line at high speeds. Only one control line per memory chip (/CAS) must toggle at the operating frequency in order to clock the internal address counter and the data input/output latches. The load on each /CAS is typically less than the load on the other control signals (/RAS, /WE and /OE) since each /CAS typically controls only a byte width of the data bus. Internal circuitry of the memory device is largely compatible with existing Extended Data Out (EDO) DRAMs. This similarity allows the two part types to be manufactured on one die with a limited amount of additional circuitry. The ability to switch between a standard non-burst mode and a high speed burst mode allows the device to be used to replace standard devices, and eliminates the need to switch to more complex high speed memory devices. Internal address generation provides for faster data access times than is possible with either fast page mode or EDO DRAMs. The high speed operation of this Burst EDO device eliminates the need to interleave memory devices in order to attain a high data throughput. In contrast to the 50 megahertz interleaved memory system described above, the output data from this device will be valid for approximately 15 nanoseconds significantly easing the design of circuitry required to latch the data from the memory. The device is compatible with existing memory module pinouts. Memory modules include, but are not limited to Single In-Line Memory Modules (SIMMs), Multi-Chip Modules (MCMs) and Dual In-Line Memory Modules (DIMMs). This combination of features allows for significant system performance improvements with a minimum of design alterations.

A system is adapted to receive Fast Page, EDO or Burst EDO mode memory devices. The devices may be installed by the system manufacture in a permanent manner such as soldered on to a system board, or interchangeably through the use of memory modules. Memory modules can be easily upgraded by the user or a technician to allow for increased density, increased performance, or lower power consumption. In the event that one memory type is unavailable, or is being sold at a higher price than other memory types, the system manufacturer can install the memory that best meets his price/performance and availability needs. If a system is sold with Fast Page Mode memory, the end user of the system can at a later date upgrade the system to EDO or Burst EDO memory to achieve a performance increase. If the system has EDO memory, the user may upgrade to Burst EDO for a significant increase in performance. Alternately, if the user desires an increase in memory capacity, but does not want to pay a higher price for high performance memory, he can upgrade in memory density with a lower performance memory type.

The system allows for multiple types of memory being present in the system concurrently. A first bank of memory for example may be Burst EDO memory, while a second bank is EDO memory. The memory controller is programmed to access the first bank in a Burst EDO format at a first access rate, and the second bank in an EDO format at a second access rate. Most frequently accessed data should be stored in the bank with the fastest access capability. This allows the user to have high memory capacity, and high speed access to at least a portion of the memory.

The system on power up or reset can determine the type of memory present in each memory bank, and adjust memory access signal timing parameters accordingly. The user has a greater ability to control the systems price/performance characteristics.

BRIEF DESCRIPTION OF THE DRAWINGS

The features of the invention as well as objects and advantages will be best understood by reference to the appended claims, detailed description of particular embodiments and accompanying drawings where:

FIG. 2 is a table showing linear versus interleaved addressing formats;

DETAILED DESCRIPTION OF THE PREFERRED EMBODIMENTS

Figure 1:
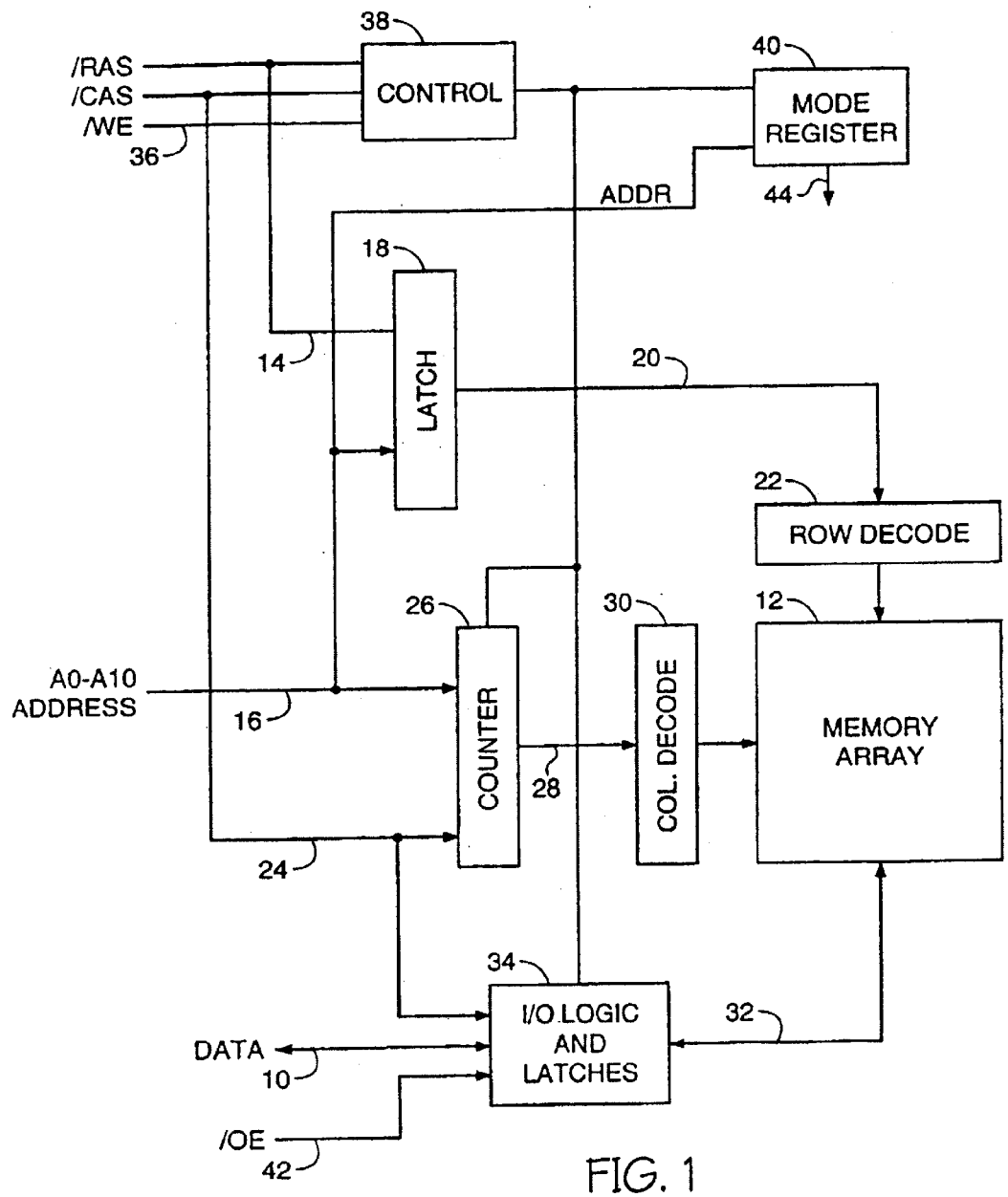
FIG. 1 is an electrical schematic diagram of a Burst EDO memory device.

FIG. 1 is a schematic representation of a sixteen megabit device designed in accordance with the present invention. The device is organized as a 2 Meg×8 burst EDO DRAM having an eight bit data input/output path 10 providing data storage for 2,097,152 bytes of information in the memory array 12. The device of FIG. 1 has an industry standard pinout for eight bit wide EDO DRAMs. An active-low row address strobe (/RAS) signal 14 is used to latch a first portion of a multiplexed memory address, from address inputs A0 through A10 16, in latch 18. The latched row address 20 is decoded in row decoder 22. The decoded row address is used to select a row of the memory array 12. A column address strobe (/CAS) signal 24 is used to latch a second portion of a memory address from address inputs 16 into column address counter 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with /CAS after a predetermined number of /CAS cycle delays (latency). For a two cycle latency design, the first /CAS falling edge is used to latch the initial address for the burst access. The first burst data from the memory is driven from the memory after the second /CAS falling edge, and remains valid through the third /CAS falling edge. Once the memory device begins to output data in a burst read cycle, the output drivers 34 will continue to drive the data lines without tri-stating the data outputs during /CAS high intervals dependent on the state of the output enable and write enable (/OE and /WE) control lines, thus allowing additional time for the system to latch the output data. Once a row and a column address are selected, additional transitions of the /CAS signal are used to advance the column address within the column address counter in a predetermined sequence. The time at which data will be valid at the outputs of the burst EDO DRAM is dependent only on the timing of the /CAS signal provided that /OE is maintained low, and /WE remains high. The output data signal levels may be driven in accordance with standard CMOS, TTL, LVTTL, GTL, or HSTL output level specifications or others.

The address may be advanced linearly, or in an interleaved fashion for maximum compatibility with the overall system requirements. FIG. 2 is a table which shows linear and interleaved addressing sequences for burst lengths of 2,4 and 8 cycles. The "V" for starting addresses A1 and A2 in the table represent address values that remain unaltered through the burst sequence. The column address may be advanced with each /CAS transition, each pulse, or multiple of /CAS pulses in the event that more than one data word is read from the array with each column address. When the address is advanced with each transition of the /CAS signal, data is also driven from the part after each transition following the device latency which is then referenced to each edge of the /CAS signal. This allows for a burst access cycle where the highest switching control line (/CAS) toggles only once (high to low or low to high) for each memory cycle. This is in contrast to standard DRAMs which require /CAS to go low and then high for each cycle, and synchronous DRAMs which require a full clock cycle (high and low transitions) for each memory cycle. For maximum compatibility with existing EDO DRAM devices, the invention will be further described in reference to a device designed to latch and advance a column address on falling edges of the /CAS signal.

It may be desirable to latch and increment the column address after the first /CAS falling edge in order to apply both the latched and incremented addresses to the array at the earliest opportunity in an access cycle. For example, a device may be designed to access two data words per cycle (prefetch architecture). The memory array for a prefetch architecture device may be split into odd and even array halves. The column address least significant bit is then used to select between odd and even halves while the other column address bits select a column within each of the array halves. In an interleaved access mode with column address 1, data from columns 0 and 1 would be read and the data from column 1 would be output followed by the data from column 0 in accordance with standard interleaved addressing as described in SDRAM specifications. In a linear access mode column address 1 would be applied to the odd array half, and incremented to address 2 for accessing the even array half to fulfill the two word access. One method of implementing this type of device architecture is to provide a column address incrementing circuit between the column address counter and the even array half. The incrementing circuit would increment the column address only if the initial column address in a burst access cycle is odd, and the address mode is linear. Otherwise the incrementing circuit would pass the column address unaltered. For a design using a prefetch of two data accesses per cycle, the column address would be advanced once for every two active edges of the /CAS signal. Prefetch architectures where more than two data words are accessed are also possible.

Other memory architectures applicable to the current invention include a pipelined architecture where memory accesses are performed sequentially, but each access may require more than a single cycle to complete. In a pipelined architecture the overall throughput of the memory will approach one access per cycle, but the data out of the memory may be offset by a number of cycles due to the pipeline length and/or the desired latency from /CAS.

In the burst access memory device, each new column address from the column address counter is decoded and is used to access additional data within the memory array without the requirement of additional column addresses being specified on the address inputs 16. This burst sequence of data will continue for each /CAS falling edge until a predetermined number of data accesses equal to the burst length has occurred. A /CAS falling edge received after the last burst address has been generated will latch another column address from the address inputs 16 and a new burst sequence will begin. Read data is latched and output with each falling edge of /CAS after the first /CAS latency.

For a burst write cycle, data 10 is latched in input data latches 34. Data targeted at the first address specified by the row and column addresses is latched with the /CAS signal when the first column address is latched (write cycle data latency is zero). Other write cycle data latency values are possible; however, for today's memory systems, zero is preferred. Additional input data words for storage at incremented column address locations are latched by /CAS on successive /CAS pulses. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16. After the predetermined number of burst writes has occurred, a subsequent /CAS pulse will latch a new beginning column address, and another burst read or write access will begin.

The memory device of FIG. 1 may include the option of switching between burst EDO and standard EDO modes of operation. In this case, the write enable signal /WE 36 may be used at the row address latch time (/RAS falling, /CAS high) to determine whether memory accesses for that row will be burst or page mode cycles. If /WE is low when /RAS falls, burst access cycles are selected. If /WE is high at /RAS falling, standard extended data out (EDO) page mode cycles are selected. Both the burst and EDO page mode cycles allow for increased memory device operating frequencies by not requiring the data output drivers 34 to place the data lines 10 in a high impedance state between data read cycles while /RAS is low. DRAM control circuitry 38, in addition to performing standard DRAM control functions, controls the I/O circuitry 34 and the column address counter/latch 26 in accordance with the mode selected by /WE when /RAS falls. In a burst mode only DRAM, or in a device designed with an alternate method of switching between burst and non-burst access cycles, the state of /WE when /RAS falls may be used to switch between other possible modes of operation such as interleaved versus linear addressing modes.

The write enable signal is used in burst access cycles to select read or write burst accesses when the initial column address for a burst cycle is latched by /CAS. /WE low at the column address latch time selects a burst write access. /WE high at the column address latch time selects a burst read access. The level of the /WE signal must remain high for read and low for write burst accesses throughout the burst access. A low to high transition within a burst write access will terminate the burst access, preventing further writes from occurring. A high to low transition on /WE within a burst read access will likewise terminate the burst read access and will place the data output 10 in a high impedance state. Transitions of the /WE signal may be locked out during critical timing periods within an access cycle in order to reduce the possibility of triggering a false write cycle. After the critical timing period the state of /WE will determine whether a burst access continues, is initiated, or is terminated. Termination of a burst access resets the burst length counter and places the DRAM in a state to receive another burst access command. Both /RAS and /CAS going high during a burst access will also terminate the burst access cycle placing the data drivers in a high impedance output state, and resetting the burst length counter. Read data may remain valid at the device outputs if /RAS alone goes high while /CAS is active for compatibility with hidden refresh cycles, otherwise /RAS high alone may be used to terminate a burst access. A minimum write enable pulse width is only required when it is desired to terminate a burst read and then begin another burst read, or terminate a burst write prior to performing another burst write with a minimum delay between burst accesses. In the case of burst reads, /WE will transition from high to low to terminate a first burst read, and then /WE will transition back high prior to the next falling edge of /CAS in order to specify a new burst read cycle. For burst writes, /WE would transition high to terminate a current burst write access, then back low prior to the next falling edge of /CAS to initiate another burst write access.

A basic implementation of the device of FIG. 1 may include a fixed burst length of 4, a fixed /CAS latency of 2 and a fixed interleaved sequence of burst addresses. This basic implementation requires very little additional circuitry to the standard EDO page mode DRAM, and may be mass produced to provide the functions of both the standard EDO page mode and burst EDO DRAMs. This device also allows for the output enable pin (/OE) to be grounded for compatibility with many SIMM module designs. When not disabled (tied to ground), /OE is an asynchronous control which will prevent data from being driven from the part in a read cycle if it is inactive (high) prior to /CAS falling and remains inactive beyond /CAS rising. If these setup and hold conditions are not met, then the read data may be driven for a portion of the read cycle. It is possible to synchronize the /OE signal with /CAS, however this would typically increase the /CAS to data valid delay time and doesn't allow for the read data to be disabled prior to /RAS high without an additional /CAS low pulse which would otherwise be unnecessary. In a preferred embodiment, if /OE transitions high at any time during a read cycle the outputs will remain in a high impedance state until the next falling edge of /CAS despite further transitions of the /OE signal.

Programmability of the burst length, /CAS latency and address sequences may be accomplished through the use of a mode register 40 which latches the state of one or more of the address input signals 16 or data signals 10 upon receipt of a write-/CAS-before-/RAS (WCBR) programming cycle. In such a device, outputs 44 from the mode register control the required circuits on the DRAM. Burst length options of 2, 4, 8 and full page as well as /CAS latencies of 1, 2 and 3 may be provided. Other burst length and latency options may be provided as the operating speeds of the device increase, and computer architectures evolve. The device of FIG. 1 includes programmability of the address sequence by latching the state of the least significant address bit during a WCBR cycle. The burst length and /CAS latency for this particular embodiment are fixed. Other possible alterations in the feature sets of this DRAM include having a fixed burst mode only, selecting between standard fast page mode (non-EDO) and burst mode, and using the output enable pin (/OE) 42 in combination with /RAS to select between modes of operation. Also, a WCBR refresh cycle could be used to select the mode of operation rather than a control signal in combination with /RAS. A more complex memory device may provide additional modes of operation such as switching between fast page mode, EDO page mode, static column mode and burst operation through the use of various combinations of /WE and /OE at /RAS falling time. One mode from a similar set of modes may be selected through the use of a WCBR cycle using multiple address or data lines to encode the desired mode. Alternately, a device with multiple modes of operation may have wire bond locations, or programmable fuses which may be used to program the mode of operation of the device.

A preferred embodiment of a sixteen bit wide burst EDO mode DRAM designed in accordance with the teachings of this invention has two column address strobe input pins /CASH and /CASL. For read cycles only one /CAS signal needs to toggle. The second /CAS may remain high or toggle with the other /CAS. During burst read cycles, all sixteen data bits will be driven out of part during a read cycle even if one /CAS remains inactive. In a typical system application, a microprocessor reads all data bits on a data bus in each read cycle, but may only write certain bytes of data in a write cycle. Allowing one of the /CAS control signals to remain static during read cycles helps to reduce overall power consumption and noise within the system. For burst write access cycles, each of the /CAS signals (CASH and /CASL) acts as a write enable for an eight bit width of the data. The two /CAS's are combined in an AND function to provide a single internal /CAS which will go low when the first external /CAS falls, and returns high after the last external /CAS goes high. All sixteen data inputs are latched when the first of the /CAS signals transitions low. If only one /CAS signal transitions low, then the eight bits of data associated with the /CAS that remained high are not stored in the memory.

The present invention has been described with reference to several preferred embodiments. Just as fast page mode DRAMs and EDO DRAMs are available in numerous configurations including x1, x4, x8 and x16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of the various memory device organizations applicable to this invention are not necessary.

Figure 3:
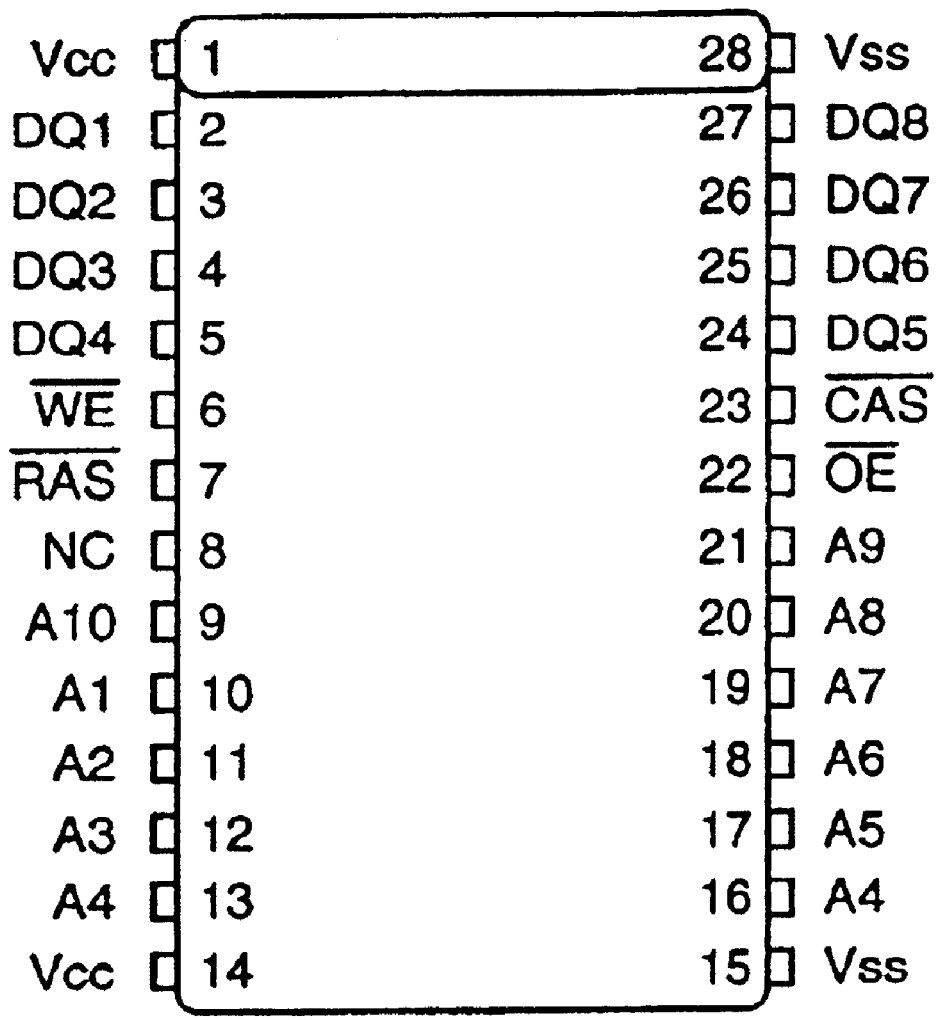
FIG. 3 is one suggested pinout of the memory device of FIG. 1.

FIG. 3 shows a preferred pinout for the device of FIG. 1. It should be noted that the pinout for this new burst EDO memory device is identical to the pinout for a standard EDO DRAM. The common pinout allows this new device to be used in existing memory designs with minimum design changes. The common pinout also allows for ease of new designs by those of skill in the art who are familiar with the standard EDO DRAM pinout. Variations of the described invention which maintain the standard EDO DRAM pinout include driving the /CAS pin with a system clock signal to synchronize data access of the memory device with the system clock. For this embodiment, it may be desirable to use the first /CAS active edge after /RAS falls to latch the row address, a later edge may be used to latch the first column address of a burst access cycle. After row and column addresses are latched within the device, the address may be incremented internally to provide burst access cycles in synchronization with the system clock. Other pin function alternatives include driving the burst address incrementing signal on the /OE pin since the part does not require a data output disable function on this pin. Other alternate uses of the /OE pin also allow the device to maintain the standard EDO pinout, but provide increased functionality such as burst mode access. The /OE pin may be used to signal the presence of a valid column starting address, or to terminate a burst access. Each of these embodiments provides for a high speed burst access memory device which may be used in current memory systems with a minimum amount of redesign.

Figure 4:
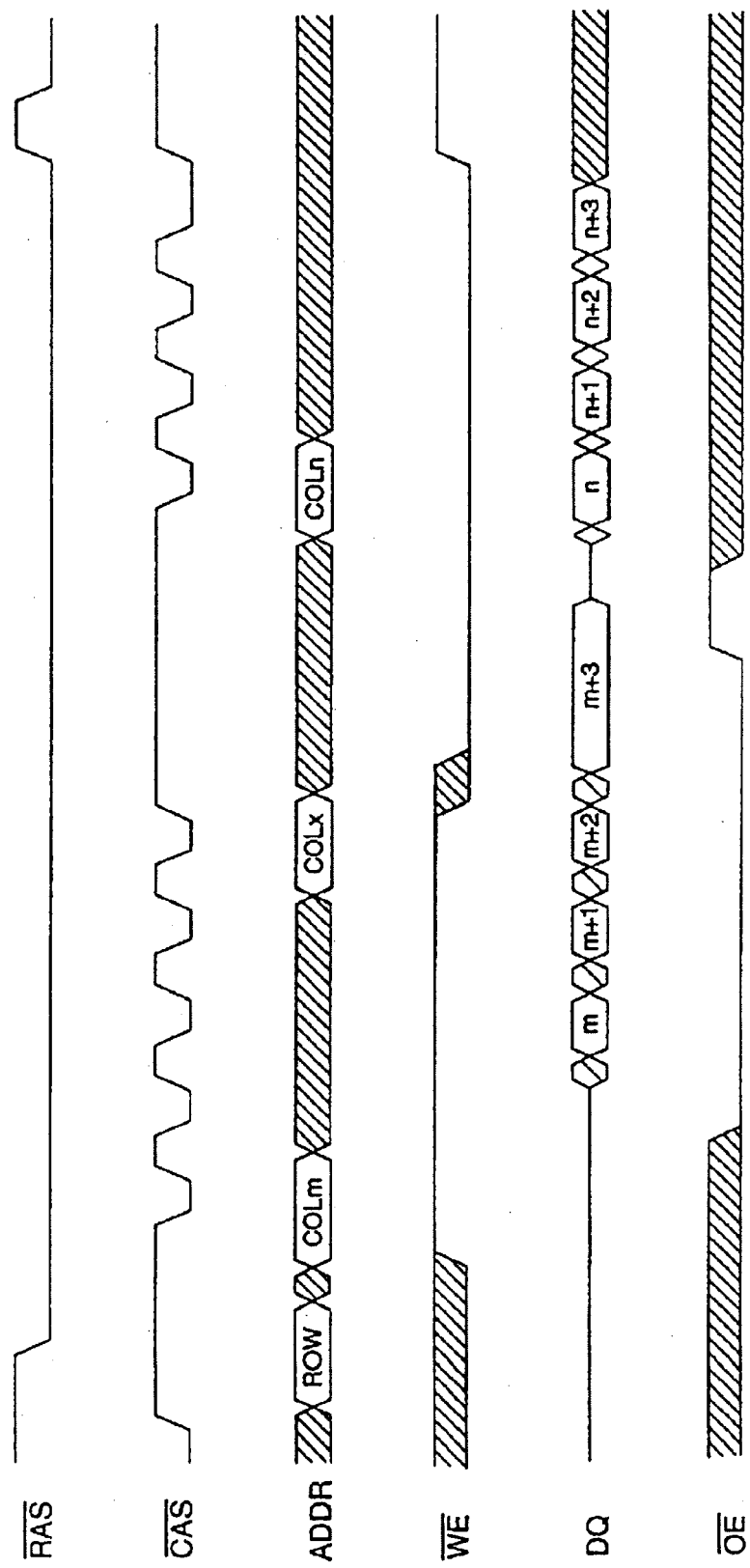
FIG. 4 is a timing diagram for a method of accessing the device of FIG. 1.

FIG. 4 is a timing diagram for performing a burst read followed by a burst write of the device of FIG. 1. In FIG. 4, a row address is latched by the /RAS signal. /WE is low when /RAS falls for an embodiment of the design where the state of the /WE pin is used to specify a burst access cycle at /RAS time. Next, /CAS is driven low with /WE high to initiate a burst read access, and the column address is latched. The data out signals (DQ's) are not driven in the first /CAS cycle. On the second falling edge of the /CAS signal, the internal address generation circuitry advances the column address and begins another access of the array, and the first data out is driven from the device after a /CAS to data access time (tCAC). Additional burst access cycles continue, for a device with a specified burst length of four, until the fifth falling edge of /CAS which latches a new column address for a new burst read access. /WE falling in the fifth /CAS cycle terminates the burst access, and initializes the device for additional burst accesses. The sixth falling edge of /CAS with /WE low is used to latch a new burst address, latch input data and begin a burst write access of the device. Additional data values are latched on successive /CAS falling edges until /RAS rises to terminate the burst access.

Figure 5:
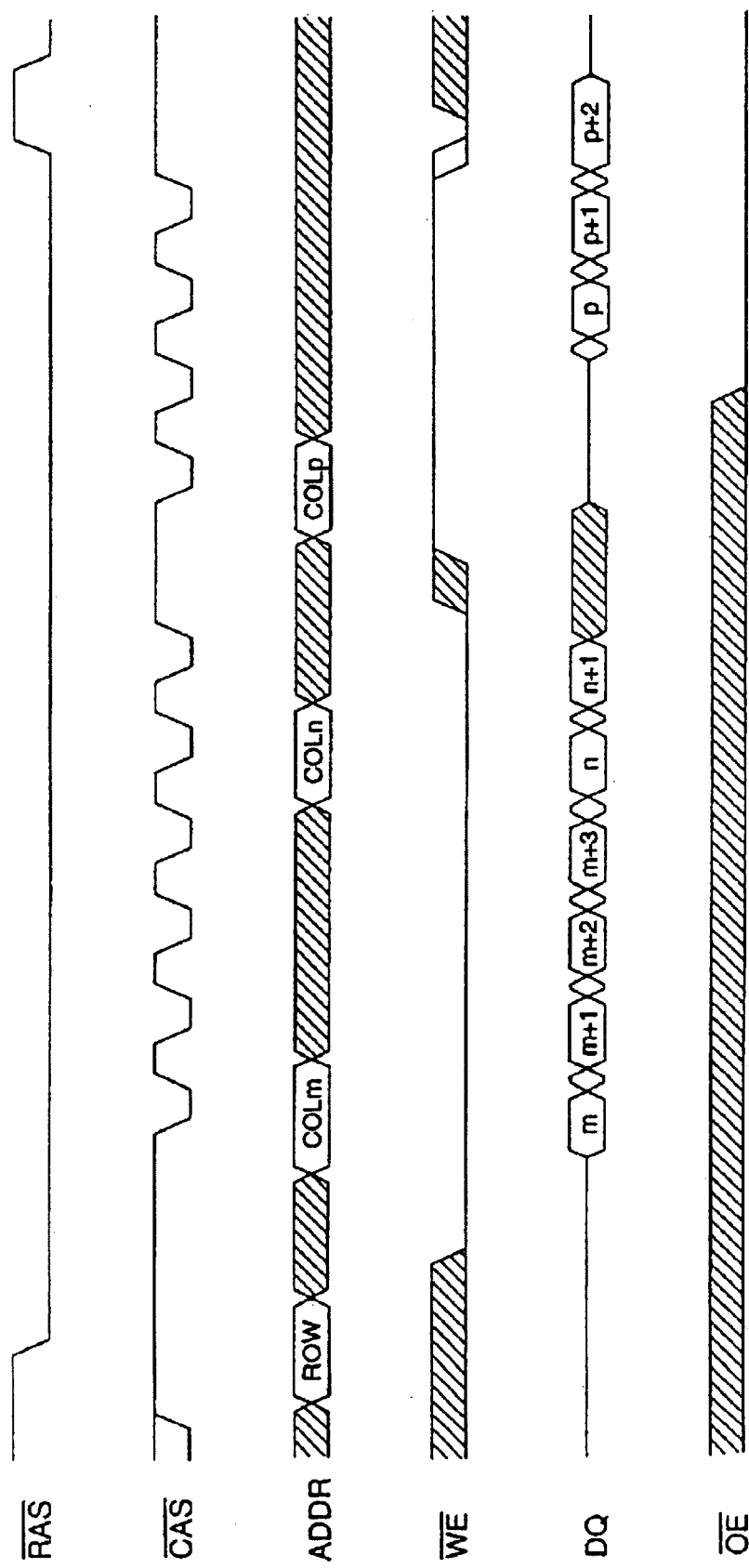
FIG. 5 is a further timing diagram for accessing the device of FIG. 1.

FIG. 5 is a timing diagram depicting burst write access cycles followed by burst read cycles. As in FIG. 4, the /RAS signal is used to latch the row address. The first /CAS falling edge in combination with /WE low begins a burst write access with the first data being latched. Additional data values are latched with successive /CAS falling edges, and the memory address is advanced internal to the device in either an interleaved or sequential manner. On the fifth /CAS falling edge a new column address and associated write data are latched. The burst write access cycles continue until the /WE signal goes high in the sixth /CAS cycle. The transition of the /WE signal terminates the burst write access. The seventh /CAS low transition latches a new column address and begins a burst read access (/WE is high). The burst read continues until /RAS rises terminating the burst cycles.

It should be noted from FIG's. 3 and 4, that for burst read cycles the data remains valid on the device outputs as long as the /OE pin is low, except for brief periods of data transition. Also, since the /WE pin is low prior to or when /CAS falls, the data input/output lines are not driven from the part during write cycles, and the /OE pin is a "don't care". Only the /CAS signal and the data signals toggle at relatively high frequency, and no control signals other than /CAS are required to be in an active or inactive state for one /CAS cycle time or less. This is in contrast to SDRAMs which often require row address strobes, column address strobes, data mask, and read/write control signals to be valid for one clock cycle or less for various device functions. Typical DRAMs also allow for the column address to propagate through to the array to begin a data access prior to /CAS falling. This is done to provide fast data access from /CAS falling if the address has been valid for a sufficient period of time prior to /CAS falling for the data to have been accessed from the array. In these designs an address transition detection circuit is used to restart the memory access if the column address changes prior to /CAS falling. This method actually requires additional time for performing a memory access since it must allow for a period of time at the beginning of each memory cycle after the last address transition to prepare for a new column address. Changes in the column address just prior to /CAS falling may increase the access time by approximately five nanoseconds. An embodiment of the present invention will not allow the column address to propagate through to the array until after /CAS has fallen. This eliminates the need for address transition detection circuitry, and allows for a fixed array access relative to /CAS.

Figure 6:
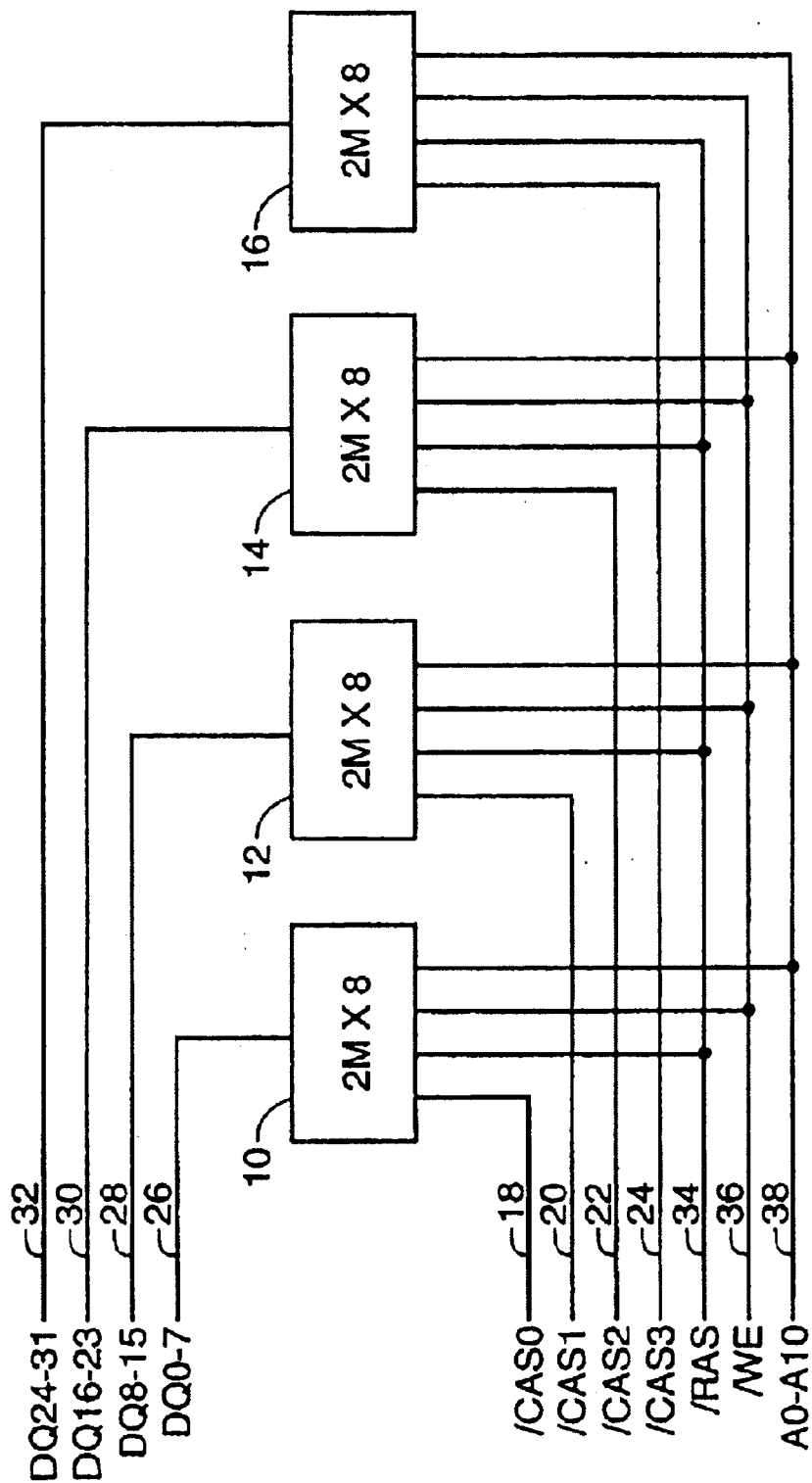
FIG. 6 is an electrical schematic diagram of a Single In-Line Memory Module.

FIG. 6 is a schematic representation of a single in-line memory module (SIMM) designed in accordance with the present invention. The SIMM has a standard SIMM module pinout for physical compatibility with existing systems and sockets. Functional compatibility with EDO page mode SIMMs is maintained when each of the 2 Meg×8 memory devices 10, 12, 14 and 16 are operated in an EDO page mode. Each of the /CAS signals 18, 20, 22 and 24 control one byte width of the 32 bit data bus 26, 28, 30 and 32. A /RAS 34 signal is used to latch a row address in each of the memory devices, and is used in combination with /WE 36 to select between page mode and burst mode access cycles. Address signals 38 provide a multiplexed row and column address to each memory device on the SIMM. In burst mode, only active /CAS control lines are required to toggle at the operating frequency of the device, or at half the frequency if each edge of the /CAS signal is used as described above. The data lines are required to be switchable at half of the frequency of the /CAS lines or at the same frequency, and the other control and address signals switch at lower frequencies than /CAS and the data lines. As shown in FIG. 6, each /CAS signal and each data line is connected to a single memory device allowing for higher frequency switching than the other control and address signals. Each of the memory devices 10, 12, 14 and 16 is designed in accordance with the present invention allowing for a burst mode of operation providing internal address generation for sequential or interleaved data access from multiple memory address locations with timing relative to the /CAS control lines after a first row and column address are latched.

Figures 7, 8:
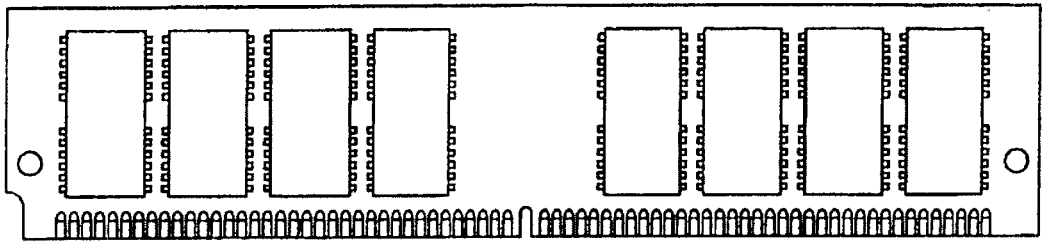
FIG. 7 is a front view of a Single In-Line Memory Module.
FIG. 8 is a table of the pin numbers and signal names of the Single In-Line Memory Module of FIG. 7.

FIG. 7 shows a front view of another SIMM designed in accordance with the present invention. Each device on the SIMM is a 4 Megabit DRAM organized as 1 Meg×4. In this configuration, a single /CAS controls two memory devices to provide access to a byte width of the data bus. The eight devices shown form a 4 Megabyte SIMM in a 32 bit width. For an 8 Megabyte SIMM in a 32 bit width, there are eight additional devices on the back side (not shown).

FIG. 8 shows a preferred pinout for a memory module designed in accordance with the device of FIG. 7. This pinout is compatible with pinouts for Fast Page Mode SIMMs and EDO SIMMs. A presence detect pin is provided for indication of EDO operation on pin 66, and in accordance with standard EDO part types, an /OE input is provided on pin 46.

Alternate embodiments of the SIMM modules of FIG's. 5, 6 and 7 include the use of two /RAS signals with each controlling a sixteen bit width of the data bus in accordance with standard SIMM module pinouts. Four more 2M×8 EDO Burst Mode DRAMs may be added to the device of FIG. 6 to provide for a 4M×32 bit SIMM. Sixteen bit wide DRAMs may also be used, these will typically have two /CAS signals each of which controls an eight bit data width. The incorporation of parity bits, or error detection and correction circuitry provide other possible SIMM module configurations. Methods of performing error detection and/or correction are well known to those of skill in the art, and detailed descriptions of such circuits are not provided in this application. Additional SIMM designs using the novel memory device of the present invention may be designed by one of skill in the art with the aid of this specification. The invention has been described with reference to SIMM designs, but is not limited to SIMMs. The invention is equally applicable to other types of memory modules including Dual In-Line Memory Modules (DIMMs) and Multi-Chip Modules (MCMs).

Figure 9:
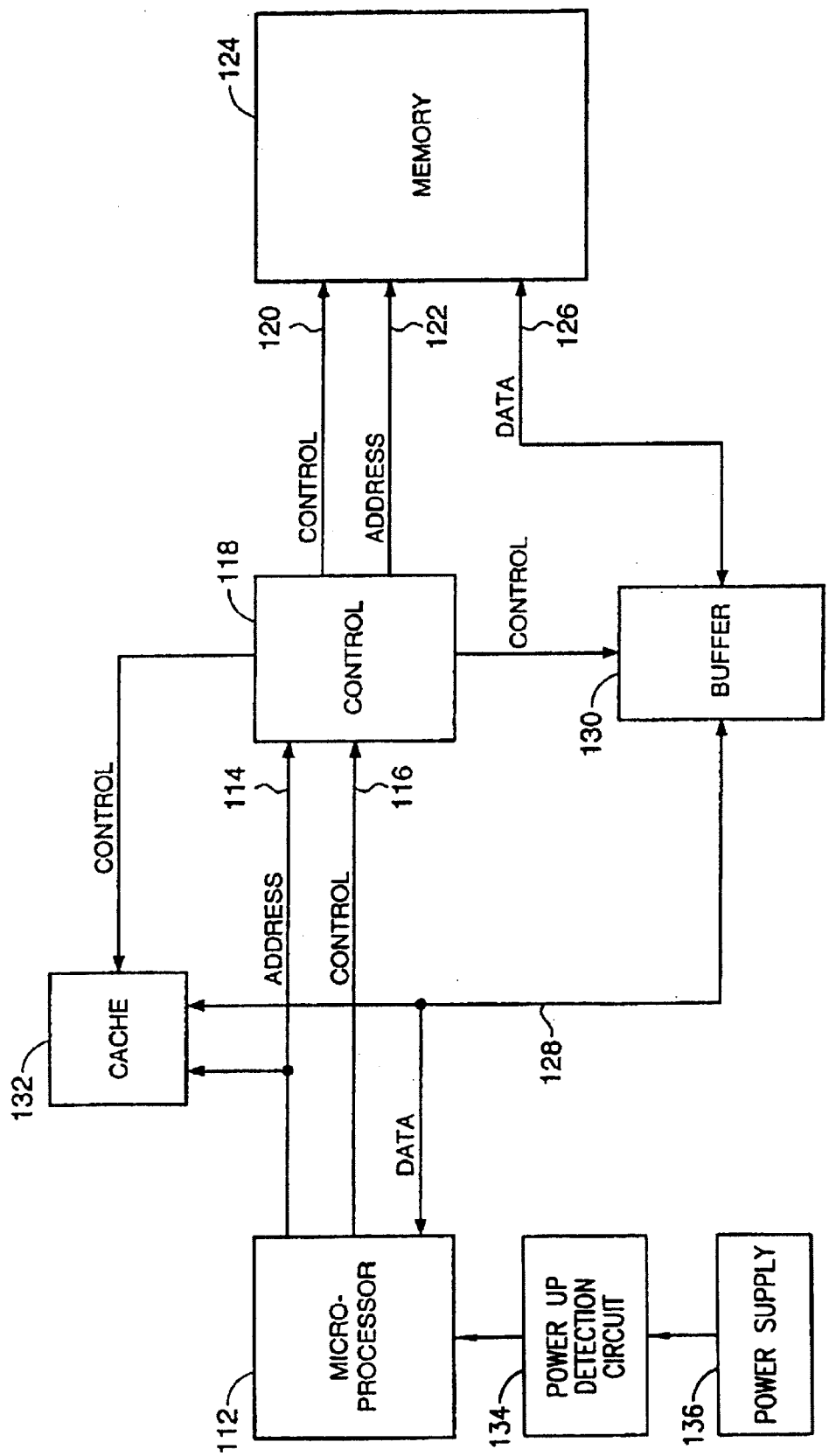
FIG. 9 is a schematic diagram of a system designed in accordance with the present invention.

FIG. 9 is a schematic representation of a data processing apparatus designed in accordance with the present invention. For the purposes of this specification a microprocessor may be, but is not limited to, a microprocessor, a microcontroller, a digital signal processor, or an arithmetic processor. In FIG. 9, microprocessor 112 is connected via address lines 114 and control lines 116 to a memory control circuit 118. The memory control circuit provides address and control signals on lines 122 and 120 respectively to a memory 124. Additional buffer circuitry between the memory control circuit and the memory, for the address and/or control signals, may be provided. The memory sends and receives data over data bus 126. Optional data bus buffer 130 between memory data bus 126 and microprocessor data bus 128 allows for amplification of the data signals, and/or synchronization with the microprocessor and memory control signals. The buffer may be, but is not limited to, a buffer, transceiver, latch, register, or registered transceiver. A fast static random access memory (SRAM) cache circuit 132 is also optional and provides higher speed access to data stored in the cache from the memory circuit or the microprocessor. A power up detection circuit 134 may be coupled to microprocessor 112 and to a power supply 136. Power up detection circuit 134 is responsive to a signal from power supply 136 to cause microprocessor 112 to access a nonvolatile memory device to receive information enabling microprocessor 134 to detect the mode of a memory device of memory 124 and to program memory control circuit 118 in accordance with the memory device mode. Memory control circuit 118 may be incorporated within the microprocessor. The memory control circuit provides the required address strobe signals, address signals and read/write control signals required to access a variety of memory types. The capability of the processor to access the memory in a burst mode allows for the design of a computer with relatively high memory bandwidth without the requirement of a fast SRAM cache. SRAMs which are fast enough to provide memory access without wait states can significantly add to the cost of a computer. The ability of the system to accept Burst EDO memory in accordance with the present invention also allows for medium to high performance computers to be manufactured at a cost which is significantly less than those manufactured today. Use of burst access memory in cooperation with a fast SRAM cache allows for an even higher performance computer design by providing fast burst access of main memory in the event of a cache miss.

In operation, when Burst EDO memory is present the microprocessor reads data by supplying address and control signals to the memory through the memory control circuit. In response to an initial address, a read command and an access cycle strobe, the memory begins to access a first data word at the initial address. A second access cycle strobe advances the address within the memory in a second access period of the burst access, and initiates a read access of data from a second address. For a latency of two, the first data is driven from the memory after the second access cycle strobe signal occurs. Typically the first data is latched in the microprocessor in response to a third access cycle strobe which occurs at the beginning of a third access cycle period of the burst access. The third access cycle strobe also causes the second data value to be driven from the memory. The third access cycle strobe also causes a third address to be generated within the memory, and a third data access begins. Data is latched in the microprocessor in response to fourth, fifth and sixth access cycle strobes. In this manner four data values are received in the microprocessor in response to a single address and a plurality of access cycle strobes. The microprocessor may provide a second address to the memory with the fifth access cycle strobe signal if the memory is designed to perform four word burst sequences and additional data values are required from the memory. In this case, a second four word burst sequence is begun while the microprocessor is receiving data from the first four word burst. The data buffer 130 may be used to synchronize data from the memory received in response to the access cycle strobe signal, with a system clock which is connected to the microprocessor. For write cycles, there is typically no latency. Data for write cycles is provided with each access cycle strobe signal in a burst write sequence.

In a preferred embodiment of the present invention, the system of FIG. 9 will operate with one of two or more different types of memory. For example, the system may operate with Burst EDO, Fast Page Mode, or EDO memory devices. The system for example, may be adapted to receive memory modules having Fast Page Mode, EDO or Burst EDO memory devices where the modules have identical or nearly identical pinouts.

Figure 10:
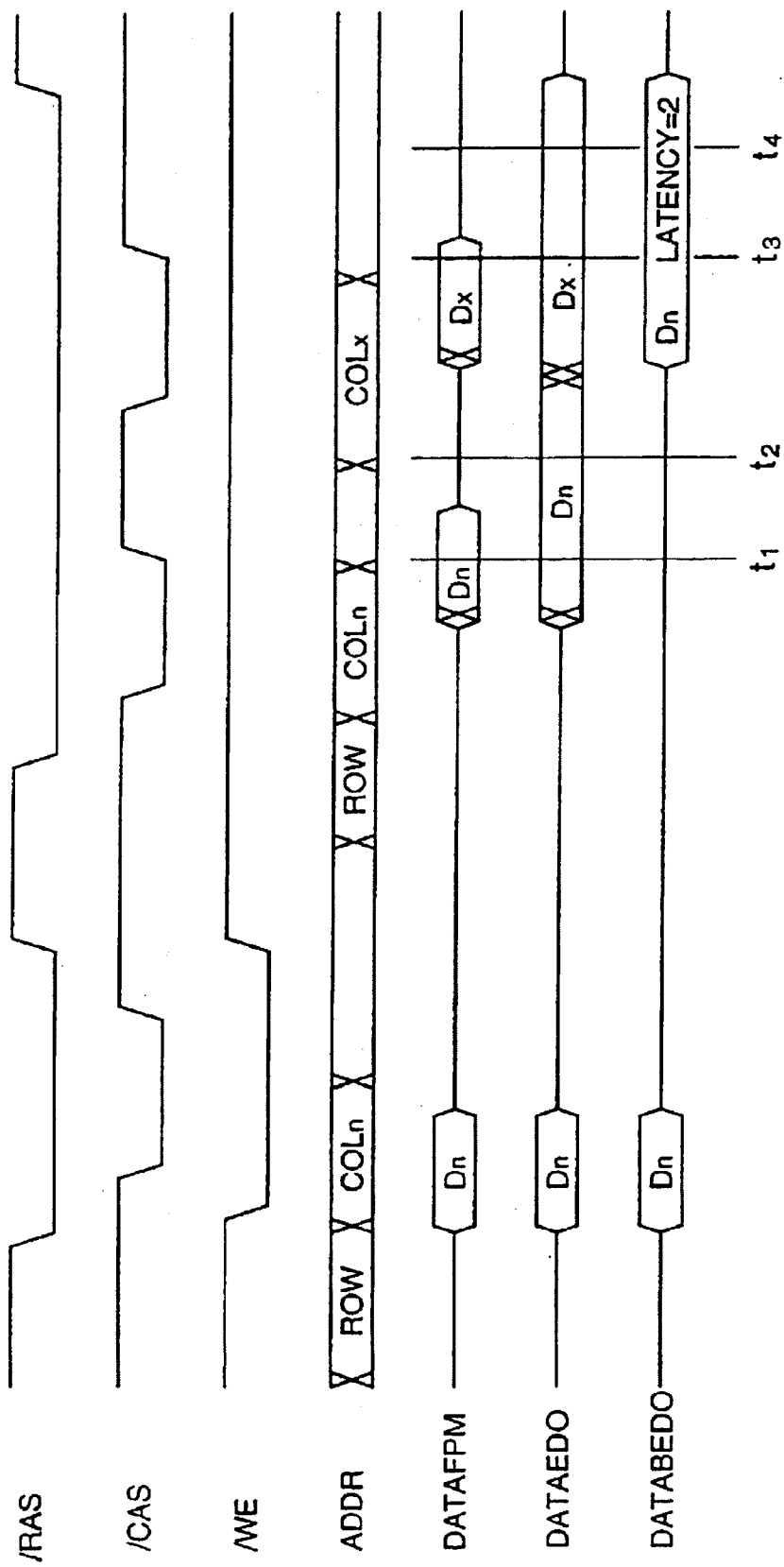
FIG. 10 is a timing diagram of one method of determining which type of memory is present in a system.

In this system, a method of detecting the type of memory present utilizes some or all of the following steps: Write a first data pattern into the memory at address n; toggle /CAS low with a read command at address n; sample the data output of the memory; toggle /CAS high; sample the data output of the memory. If the first data sample matches the data written into the memory, then the memory is either Fast Page Mode or EDO provided that the address to data valid and /CAS to data valid times have been met for both types of memory. If the second sample matches the data written into the memory, then the memory is EDO since the data bus will not be driven while /CAS is high for Fast Page Mode, and the latency will not have been met for Burst EDO memory. If the first pattern matches, but the second does not, then the memory is Fast Page Mode. If valid data is not detected for /CAS low or /CAS high, then the memory is Burst EDO. /CAS may be toggled low to perform additional read cycles with or without altering the column address to detect valid data to verify the presence of Burst EDO memory and to determine the latency. A system which is designed to accept only one of Fast Page Mode and EDO or Burst EDO memory would only need to sample data at the appropriate time (/CAS low for Fast Page Mode, and /CAS high for EDO) during the first read cycle to determine which type of memory is present. Systems designed to accept only EDO or Burst EDO memory for example may not have the capability of sampling data while /CAS is low when Fast Page Mode data would be valid. FIG. 10 shows a timing diagram where a known data pattern Dn is written into memory in a format which is compatible with each of the possible memory types that may be present in the system. At time t1, the memory output is sampled while /CAS is low as described above. If valid data is not read, then the memory is Burst EDO. At time t2, the memory output is sampled while /CAS is high. If valid data was read at time t1, then the presence or absence of valid data at time t2 will reveal whether the data is Fast Page Mode or EDO. For Burst EDO memory with a latency of two, data sampled at time t3 or t4 will match the data written into the memory. At time t4 in particular, each of the three memory types would provide a different result on the memory data outputs allowing for memory type determination.

A method for differentiating between Burst EDO and Fast Page Mode or EDO alternately utilizes the following steps: Write a first data pattern into the memory at address n; write a second data pattern into the memory at address n+1; write a third data pattern into the memory at address n+2; write a fourth data pattern into the memory at address n+3; cycle /CAS five times to read data in a Burst EDO burst read format while maintaining address n on the external address lines. The data may be written in single discrete cycles, page mode cycles, or in Burst EDO format. If the data received matches the data written but is offset by at least one cycle (latency), then the memory is Burst EDO. If the memory is not Burst EDO, then the data read will be either all equal to the data pattern written at address n if single cycles or page mode writes were performed and the memory is EDO memory, or the data will be equal to the data pattern written at address n+3 if Burst EDO writes were performed and the memory is EDO memory, or the data will be dependent upon the characteristics of the data bus and the memory is Fast Page Mode memory. If the data is sampled while /CAS is high and the memory is Fast Page Mode, then the data bus may float high, low, or be unknown when the data is sampled. If the data is sampled while /CAS is low, then Fast Page Mode memory will provide the same data as EDO memory.

In the event that the data output of the memory is only sampled while /CAS is high and valid data is not received, the memory should be accessed in a Fast Page Mode format to verify the presence of Fast Page Mode memory.

Figure 11:
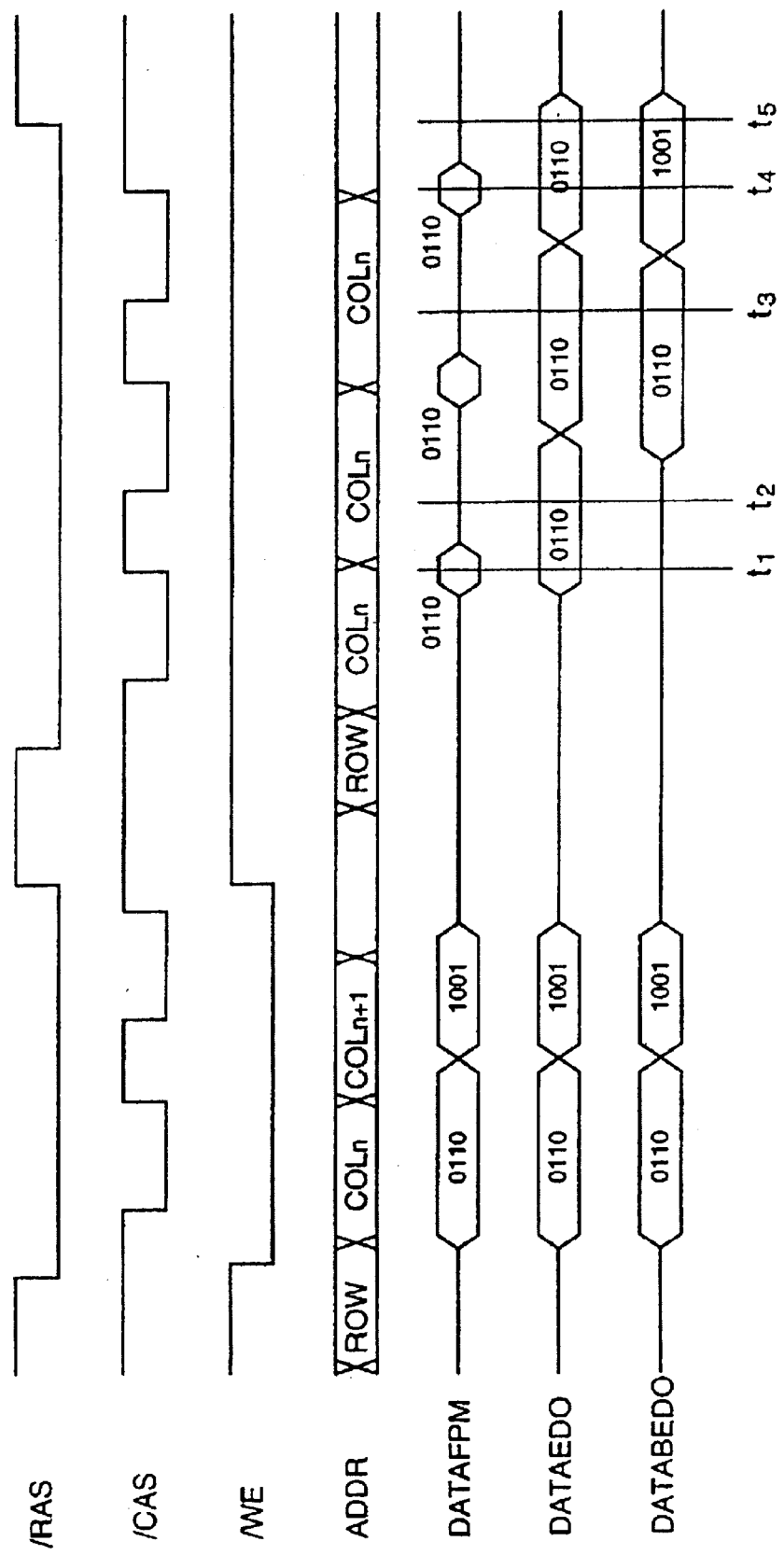
FIG. 11 is a timing diagram of another method of determining which type of memory is present in a system.

FIG. 11 is a timing diagram of another method of determining which type of memory is present in a system, in accordance with the teachings of this invention. For the purposes of providing a specific example, the data values shown correspond to a system where the data width is four bits. In practice, a typical system data bus may have 8, 16, 32, 64 or some other data width. Likewise while the timing diagram may be viewed with reference to the system of FIG. 9, the method described is equally useful for a wide variety of system configurations in accordance with the teachings of the present invention which are capable of utilizing memory devices which may operate in one or more of at least two different access modes. In FIG. 11, two data values are written into memory using a page mode write format. This format will correctly store data into Fast Page Mode, EDO, or Burst EDO memory devices. If the memory is Burst EDO, the second column address presented (Cn+1) will simply be ignored by the memory device or devices being written to since the second address will be internally generated. After the writing the two data values (0110 and 1001) which should be chosen to be easily distinguishable from each other and from a bus that is not driven, the memory is read in a Burst EDO format The waveform labeled DATA FPM is a representation of the data bus for a system where Fast Page Mode memory is installed. The waveform labeled DATA EDO is a representation of the data bus for a system where EDO memory is installed. The waveform labeled DATA BEDO is a representation of the data bus for a system where Burst EDO memory is installed. The vertical lines t1, t2, t3, t4 and t5 represent some possible times when data may be sampled in order to differentiate between the possible types of memory present in the system. At time t5 in particular, each memory type provides a different response to the read operation. Fast Page Mode memory will not be driving the data bus at time t5 since /CAS is high. When the bus is not driven, it will typically float or be terminated to a level that will be digitally interpreted as being either high, low, or a pattern of high and low values. In any case the data is not likely to match the pattern written. For systems utilizing a narrow data bus, or if the bus characteristics are unknown, it may be desirable to repeat the method with various data patterns to guarantee that the bus is not tending to provide signal levels that would be interpreted as a match of the data that was written. For wide data buses, the likelihood of an undriven bus matching a random or suitably varying pattern of data bits is very remote, and multiple patterns may not be deemed necessary. A possible pattern for a 32 bit data bus for example may be 0110 1001 1111 0001 1100 0011 0000 1110. At time t5, EDO memory will drive data onto the data bus from column address Cn since the read address is not changing from cycle to cycle. For the example of FIG. 11, this value is 0110. At time t5, Burst EDO memory with a latency of two will provide data from column address Cn+1 since the Burst EDO memory will automatically increment the internal address in a burst read access cycle. In this manner, the memory type whether Fast Page Mode, EDO, or Burst EDO can be determined at time t5. A more comprehensive method will perform more than two write and three read cycles in order to allow for Burst EDO memory devices with latencies of other than two. For example, if four write cycles are followed by five read cycles, and the data is sampled with /CAS high after the fifth read cycle, then the data will be bus dependent for Fast Page Mode memory, still equal to the first data value for EDO memory, and either equal to the fourth, third or second data value for Burst EDO memory with latency equal to two three or four respectively.

Another method in accordance with the present is invention is to write in single cycles to nonsequential addresses to write data into those addresses regardless of the memory type, then read the memory in a page mode like format with timing that is compatible with each of the memory types, but with a different address order. For example, write D1, D2, D3 and D4 to addresses 00,10,11,01 respectively using single cycles (toggling both /RAS and /CAS for each cycle), then read from 00, 11, 01, 10 in a page mode like format. Burst EDO memory will read the data in the order of D1, D4, D2, and D3 offset in time by the latency. Fast Page Mode and EDO memory will read the data in the order D1, D3, D4 and D2 without latency. Again, if the data is sampled after /CAS has been high (at /CAS falling edges for example), then the data from Fast Page Mode devices will most likely not be valid.

Another method of detecting a memory type in a system in accordance with an embodiment of this invention is to write to a number of memory locations using a page mode write format directed to nonsequential addresses, then read in a page mode format from sequential addresses. For example, the two least significant address bits may be toggled in the sequence 00, 10, 11, 01 for the data write cycles. For page mode memory, the data will be valid but out of order if it is sampled after the data is valid and prior to /CAS transitioning high which will tri-state the data bus. For EDO memory, the data will be valid but out of order if sampled after the data is valid and prior to the following /CAS low transition. For Burst EDO memory, the data will be read in order since the address least significant bits will have been generated within the memory in the same order for the read and the write cycles. The Burst EDO data will have a latency from /CAS. As few as two locations may be written, followed by a single read cycle to the second address. In this case, if valid data is sampled while /CAS is low, the memory must be Fast Page or EDO. If valid data is sampled after /CAS transitions high, the memory is EDO. If valid data is not detected, the memory is Burst EDO.

A simplified method of determining the type of memory present in accordance with the teachings of the present invention for a system utilizing SIMMs, makes use of the EDO presence detect pin. If the EDO presence detect is false, then the memory is Fast Page Mode memory. If the presence detect is true, then the memory need only be tested for EDO versus Burst EDO, or for memory devices with multiple modes of operation.

An additional method in accordance with the present invention is to write the data in a burst mode format maintaining the column address at Cn while toggling /CAS and providing multiple data patterns. A read cycle at address Cn+x, where Cn+x is within a range of addresses that would have been written to in a Burst EDO memory device, is then performed as part of a burst or page mode read sequence. The data pattern read from address Cn+x will match the pattern written to Cn+x after a latency if the memory is Burst EDO memory. Fast Page Mode and EDO memory will provide whatever data was present at Cn+x prior to the burst mode write. Alternately, a single read cycle to address Cn, where the data is sampled near the end of the /CAS low period, will provide valid data out for either Fast Page Mode or EDO memory, but not for Burst EDO memory since the latency will not have been met.

In each of the above methods for determining a memory type present in a system, the step of placing the memory in a particular mode should be performed if it is known that the memory itself may have multiple modes of operation. The memory may be tested after following the appropriate procedure for placing the memory in each of the possible desired modes of operation in order to determine what modes of operation the memory will support. Also, linear versus sequential addressing modes must be taken into account if the memory may have the ability to switch between these addressing modes. Any SRAM cache should be disabled prior to performing the methods described, or additional steps may be required to guarantee that data being read is not cached data only. Also, a known background data pattern may be written to an address range where the method will be used in order to avoid possible false data matches to uninitialized memory locations.

The present invention teaches a system having multiple memory banks where each memory bank may have one of several types of memory. For systems designed in accordance with this teaching, each bank may be individually tested as described above. The memory controller of the system is programmed to access each bank in accordance with the type of memory present.

While the present invention has been described with reference to preferred embodiments, numerous modifications and variations of the invention will be apparent to one of skill in the art without departing from the scope of the invention.

What is claimed is:

1. A system, comprising:

a bus for transferring information;

a memory, coupled to the bus, comprised of a memory device which is interchangeably of a mode selected from the group consisting of burst extended data out mode and fast page mode, the memory having a first set of access control signal timing requirements for the burst extended data out mode and a second set of access control signal timing requirements for the fast page mode;

a programmable memory controller, coupled to the bus and to the memory, capable of providing the first set of access control signal timing requirements and the second set of access control signal timing requirements to the memory; and a processor, coupled to the bus and the memory controller, responsive to at least information from the memory to program the memory controller to provide a set of access control signals to the memory in accordance with the memory device mode, wherein the information from the memory includes data read from the memory device, wherein the processor is adapted to indicate an extended data out mode with data read from memory matching data written to the memory at address n using a data pattern in a format selected from a group consisting of single discrete cycles and pane mode cycles, and with the data read from memory matching the data written to the memory at address n+3 in a burst format.

2. The system of claim 1, further comprising:

a power supply; and a power up detection circuit coupled to the processor and to the power supply, the power up detection circuit responsive to a signal from the power supply to cause the processor to detect the memory device mode and to program the memory controller in accordance with the memory device mode.

3. A system, comprising:

a bus for transferring information;

a memory, coupled to the bus, comprised of a memory device which is interchangeably of a mode selected from the group consisting of burst extended data out mode and fast page mode, the memory having a first set of access control signal timing requirements for the burst extended data out mode and a second set of access control signal timing requirements for the fast page mode;

a programmable memory controller, coupled to the bus and to the memory, capable of providing the first set of access control signal timing requirements and the second set of access control signal timing requirements to the memory;

a processor, coupled to the bus and the memory controller;

a power supply; and a power up detection circuit coupled to the processor and to the power supply, the power up detection circuit responsive to a signal from the power supply to cause the processor to detect the memory device mode and to program the memory controller;

wherein the processor is responsive to at least information from the memory to program the memory controller to provide a set of access control signals to the memory in accordance with the memory device mode, wherein the information from the memory includes data read from the memory device, and wherein the processor is adapted to indicate an extended data out mode with data read from memory matching data written to the memory at address n using a data pattern in a format selected from a group consisting of single discrete cycles and page mode cycles, and with the data read from memory matching the data written to the memory at address n+3 in a burst format.

4. A system, comprising:

a bus for transferring information;

a memory, coupled to the bus, comprised of a memory device which is interchangeably of a mode selected from the group consisting of burst extended data out mode and extended data Out mode, the memory having a first set of access control signal timing requirements for the burst extended data out mode and a second set of access control signal timing requirements for the extended data out mode;

a programmable memory controller, coupled to the bus and to the memory, capable of providing the first set of access control signal timing requirements and the second set of access control signal timing requirements to the memory; and a processor, coupled to the bus and the memory controller, responsive to at least information from the memory to program the memory controller to provide a set of access control signals to the memory in accordance with the memory device mode, wherein the information from the memory includes data read from the memory device, and wherein the processor is adapted to indicate an extended data out mode with data read from memory matching data written to the memory at address n using a data pattern in a format selected from a group consisting of single discrete cycles and page mode cycles, and with the data read from memory matching the data written to the memory at address n+3 in a burst format.

5. The system of claim 4, further comprising:

a power supply; and a power up detection circuit coupled to the processor and to the power supply, the power up detection circuit responsive to a signal from the power supply to cause the processor to detect the memory device mode and to program the memory controller in accordance with the memory device mode.

6. A system, comprising:

a bus for transferring information;

a memory, coupled to the bus, comprised of a memory device which is interchangeably of a mode selected from the group consisting of burst extended data out mode and extended data out mode, the memory having a first set of access control signal timing requirements for the burst extended data out mode and a second Set of access control signal timing requirements for the extended data out mode;

a programmable memory controller, coupled to the bus and to the memory, capable of providing the first set of access control signal timing requirements and the second set of access control signal timing requirements to the memory;

a processor, coupled to the bus and the memory controller;

a power supply; and a power up detection circuit coupled to the processor and to the power supply, the power up detection circuit responsive to a signal from the power supply to cause the processor to detect the memory device mode and to program the memory controller;

wherein the processor is responsive to at least information from the memory to program the memory controller to provide a set of access control signals to the memory in accordance with the memory device mode, wherein the information from the memory includes data read from the memory device; and wherein the processor is adapted to indicate an extended data out mode with data read from memory matching data written to the memory at address n using a known data pattern, and with the data read from memory matching the data written to the memory at address n+3 in a burst format.

7. A system, comprising:

a bus for transferring information;

a memory, coupled to the bus, comprised of a memory device operable in a mode selected from the group consisting of burst extended data out mode and a second operation mode, wherein the memory has a first set of access control signals for operation in the burst extended data out mode and a second set of access control signals for operation in the second operation mode;

a programmable memory controller, coupled to the bus and to the memory, capable of providing the first set of access control signals and the second set of access control signals to the memory; and a processor, coupled to the bus and the memory controller, responsive to at least information from the memory to program the memory controller to provide the first set of access control signals to the memory at a first time and the second set of access control signals to the memory at a second time, and wherein the processor is adapted to indicate an extended data out mode with data read from memory matching data written to the memory at address n using a data pattern in a format selected from a group consisting of single discrete cycles and page mode cycles, and with the data read from memory matching the data written to the memory at address n+3 in a burst format.

8. The system of claim 7, further comprising:

a power supply; and a power up detection circuit coupled to the processor and to the power supply, the power up detection circuit responsive to a signal from the power supply to cause the processor to detect the memory device mode and to program the memory controller in accordance with the memory device mode.

9. A system, comprising:

a bus for transferring information;

a memory, coupled to the bus, comprised of a memory device operable in a mode selected from the group consisting of burst extended data out mode and a second operation mode, wherein the memory has a first set of access control signals for operation in the burst extended data out mode and a second set of access control signals for operation in the second operation mode;

a programmable memory controller, coupled to the bus and to the memory, capable of providing the first set of access control signals and the second set of access control signals to the memory;

a processor, coupled to the bus and the memory controller;

a power supply; and a power up detection circuit coupled to the processor and to the power supply, the power up detection circuit responsive to a signal from the power supply to cause the processor to detect the memory device mode and to program the memory controller;

wherein the processor is responsive to at least information from the memory to program the memory controller to provide the first set of access control signals to the memory at a first time and the second set of access control signals to the memory at a second time; and wherein the processor is adapted to indicate an extended data out mode with data read from memory matching data written to the memory at address n using a known data pattern, and with the data read from memory matching the data written to the memory at address n+3 in a burst format.

10. A system, comprising:

a memory controller; and a memory, wherein the memory comprises:
　a first bank of burst extended data out memory coupled to the memory controller to receive a plurality of access control signals; and
　a second bank comprised of a memory type selected from the group consisting of extended data out memory and fast page mode memory, wherein the second bank is coupled to the memory controller to receive the plurality of access control signals, further wherein the memory controller drives the access control signals in a first mode to provide access to the first bank, still further wherein the memory controller drives the access control signals in a second mode to provide access to the second bank, the access control signals being driven in the first and second modes in response to information obtained by reading the first and second banks, respectively, and wherein the reading indicates an extended data out mode with data read from memory matching data written to the memory at address n using a known data pattern, and with the data read from memory matching the data written to the memory at address n+3 in a burst format.

11. A system, comprising:

a memory controller; and a memory, wherein the memory comprises:

a first bank and a second bank, wherein the first bank and the second bank are each independently interchangeably of a memory type selected from the group consisting of burst extended data out memory and a second type of memory, further wherein the memory controller controls access of the first bank and second bank in accordance with a first set of requirements for the burst extended data out memory and a second set of requirements for the second type of memory, and controls access of the first bank in accordance with one of the first and second sets of requirements based on information obtained by reading the first bank, which indicates an extended data out mode for the first bank with data read from memory matching data written to the memory at address n using a known data pattern, and with the data read from memory matching the data written to the memory at address n+3 in a burst format and controls access of the second bank in accordance with one of the first and second sets of requirements based on information obtained by reading the second bank.

12. A system, comprising:

a bus for transferring information;

a memory, coupled to the bus, comprised of a memory device operable in a mode selected from the group consisting of burst extended data out mode and a second operation mode, wherein the memory has a first set of access control signals for operation in the burst extended data out mode and a second set of access control signals for operation in the second operation mode;

a programmable memory controller, coupled to the bus and to the memory, capable of providing the first set of access control signal timing requirements and the second set of access control signal timing requirements to the memory; and a processor, coupled to the bus and the memory controller, responsive to at least information from the memory to program the memory controller to provide a set of access control signals to the memory in accordance with the memory device mode, wherein the information from the memory includes data read from the memory device, wherein the data read indicates an extended data out mode when the data read matches data written to the memory at address n using a known data pattern, and with the data read from memory matching the data written to the memory at address n+3 in a burst format.

13. The system of claim 12, further comprising:

a power supply; and a power up detection circuit coupled to the processor and to the power supply, the power up detection circuit responsive to a signal from the power supply to cause the processor to detect the memory device mode and to program the memory controller in accordance with the memory device mode.

14. A system, comprising:

a bus for transferring information;

a memory, coupled to the bus, comprised of a memory device operable in a mode selected from the group consisting of burst extended data out mode and a second operation mode, wherein the memory has a first set of access control signals for operation in the burst extended data out mode and a second set of access control signals for operation in the second operation mode;

a programmable memory controller, coupled to the bus and to the memory, capable of providing the first set of access control signal timing requirements and the second set of access control signal timing requirements to the memory;

a processor, coupled to the bus and the memory controller;

a power supply; and a power up detection circuit coupled to the processor and to the power supply, the power up detection circuit responsive to a signal from the power supply to cause the processor to detect the memory device mode and to program the memory controller, wherein the processor is responsive to at least information from the memory to program the memory controller to provide a set of access control signals to the memory in accordance with the memory device mode, wherein the information from the memory includes data read from the memory device, wherein the data read indicates an extended data out mode when the data read matches data written to the memory at address n using a known data pattern and with the data read from memory matching the data written to the memory at address n+3 in a burst format.

15. A system, comprising:
a processor;
a memory controller coupled to the processor;
a memory coupled to the memory controller, wherein the memory comprises:
  a first bank of burst extended data out memory coupled to the memory controller to receive a plurality of access control signals; and
  a second bank comprised of a memory type selected from the group consisting of extended data out memory and fast page mode memory, wherein the second bank is coupled to the memory controller to receive the plurality of access control signals, further wherein the memory controller drives the access control signals in a first mode to provide access to the first bank, still further wherein the memory controller drives the access control signals in a second mode to provide access to the second bank;
a power supply;
a power up detection circuit coupled to the processor and to the power supply, the power up detection circuit responsive to a signal from the power supply to cause the processor to detect the first and second modes; and
wherein the processor is adapted to indicate an extended data out mode with data read from memory matching data written to the memory at address n using a known data pattern, and with the data read from memory matching the data written to the memory at address n+3 in a burst format.

16. The system of claim 15, wherein the power up detection circuit is responsive to a signal from the power supply to program the memory controller in accordance with the first and second modes.

17. A system, comprising:
a processor;
a memory controller coupled to the processor;
a memory coupled to the memory controller, wherein the memory includes a first bank and a second bank, wherein the first bank and the second bank are each independently interchangeably of a memory type selected from the group consisting of burst extended data out memory and a second type of memory, further wherein the memory controller controls access of the first bank and second bank in accordance with a first set of requirements for the burst extended data out memory and a second set of requirements for the second type of memory;
a power supply; and
a power up detection circuit coupled to the processor and to the power supply, the power up detection circuit responsive to a signal from, the power supply to cause the processor to detect the first and second sets of requirements, wherein the data read indicates an extended data out set of requirements when the data read matches data written to the memory at address n using a known data pattern, and with the data read from memory matching the data written to the memory at address n+3 in a burst format.

18. The system of claim 17, wherein the power up detection circuit is responsive to a signal from the power supply to program the memory controller in accordance with the first and second sets of requirements.

19. A system, comprising:
a processor;
a memory controller coupled to the processor;
a memory coupled to the memory controller, wherein the memory comprises:
  a first bank of burst extended data out memory coupled to the memory controller to receive a plurality of access control signals; and
  a second bank comprised of a memory type selected from the group consisting of extended data out memory and fast page mode memory, wherein the second bank is coupled to the memory controller to receive the plurality of access control signals, further wherein the memory controller drives the access control signals in a first mode to provide access to the first bank, still further wherein the memory controller drives the access control signals in a second mode to provide access to the second bank, the access control signals being driven in the first and second modes in response to information obtained by reading the first and second banks, respectively;
a power supply; and
a power up detection circuit coupled to the processor and to the power supply, the power up detection circuit responsive to a signal from the power supply to cause the processor to detect the first and second modes by indicating an extended data out mode with data read from memory matching data written to the memory at address n using a data pattern in a format selected from a group consisting of single discrete cycles and page mode cycles, and with the data read from memory matching the data written to the memory at address n+3 in a burst format.

20. The system of claim 19, wherein the power up detection circuit is responsive to a signal from the power supply to program the memory controller in accordance with the first and second modes.

21. A system, comprising:
a processor;
a memory controller coupled to the processor;
a memory coupled to the memory controller, wherein the memory includes a first bank and a second bank, wherein the first bank and the second bank are each independently interchangeably of a memory type selected from the group consisting of burst extended data out memory and a second type of memory, further wherein the memory controller controls access of the first bank and second bank in accordance with a first set of requirements for the burst extended data out memory and a second set of requirements for the second type of memory, and controls access of the first bank in accordance with one of the first and second sets of requirements based on information obtained by reading the first bank, and controls access of the second bank in accordance with one of the first and second sets of requirements based on information obtained by reading the second bank;

a power supply; and a power up detection circuit coupled to the processor and to the power supply, the power up detection circuit responsive to a signal from the power supply to cause the processor to detect the first and second sets of requirements and to program the memory controller in accordance with the first and second sets of requirements by indicating an extended data out mode with data read from memory matching data written to the memory at address n using a data pattern in a format selected from a group consisting of single discrete cycles and page mode cycles and with the data read from memory matching the data written to the memory at address n+3 in a burst format.

22. The system of claim 21, wherein the first set of access control signal timing requirements includes only one control signal toggling at a memory operating frequency.

23. The system of claim 22, wherein the one control signal toggling at a memory operating frequency is a column address strobe.

24. The system of claim 22, wherein the one control signal toggles to clock an address counter internal to the memory device.

* * * * *

UNITED STATES PATENT AND TRADEMARK OFFICE
CERTIFICATE OF CORRECTION

PATENT NO. : 7,043,617 B2
APPLICATION NO. : 09/510375
DATED : May 9, 2006
INVENTOR(S) : Williams It is certified that error appears in the above-identified patent and that said Letters Patent is hereby corrected as shown below:

On the Title page, in field (56), under "Other Publications", in column 2, line 3, delete "goggle" and insert - - google - -, therefor.

In column 16, line 40, in Claim 1, delete "pane" and insert - - page - -, therefor.

In column 17, line 27, in Claim 4, delete "Out" and insert - - out - -, therefor.

In column 17, line 67, in Claim 6, delete "Set" and insert - - set - -, therefor.

In column 20, line 8, in Claim 11, after "format" insert - - , - -.

In column 21, line 11, in Claim 14, delete "pattern" and insert - - pattern, - -, therefor.

In column 21, line 66, in Claim 17, delete "from," and insert - - from - -, therefor.

In column 23, line 12, in Claim 21, after "mode cycles" insert - - , - -.

Signed and Sealed this

Twenty-second Day of August, 2006

JON W. DUDAS
*Director of the United States Patent and Trademark Office*